United States Patent
Yamamoto et al.

(10) Patent No.: US 11,910,671 B2
(45) Date of Patent: Feb. 20, 2024

(54) DISPLAY DEVICE AND METHOD FOR DRIVING SAME

(71) Applicant: SHARP KABUSHIKI KAISHA, Sakai (JP)

(72) Inventors: Keiichi Yamamoto, Sakai (JP); Kohhei Tanaka, Sakai (JP); Takayuki Nishiyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 392 days.

(21) Appl. No.: 17/436,537

(22) PCT Filed: Mar. 28, 2019

(86) PCT No.: PCT/JP2019/013516
§ 371 (c)(1),
(2) Date: Sep. 3, 2021

(87) PCT Pub. No.: WO2020/194643
PCT Pub. Date: Oct. 1, 2020

(65) Prior Publication Data
US 2022/0173199 A1 Jun. 2, 2022

(51) Int. Cl.
*H01L 23/00* (2006.01)
*H10K 59/131* (2023.01)
*G09G 3/3266* (2016.01)
*G09G 3/3275* (2016.01)
*H10K 59/121* (2023.01)

(52) U.S. Cl.
CPC ......... *H10K 59/131* (2023.02); *G09G 3/3266* (2013.01); *G09G 3/3275* (2013.01); *H10K 59/1213* (2023.02); *H10K 59/1216* (2023.02); *G09G 2310/0278* (2013.01)

(58) Field of Classification Search
CPC ............ H10K 59/131; H10K 59/1213; H10K 59/1216
See application file for complete search history.

(56) References Cited

U.S. PATENT DOCUMENTS

| | | |
|---|---|---|
| 2015/0379940 A1 | 12/2015 | Kishi |
| 2016/0300534 A1 | 10/2016 | Kishi |
| 2018/0033372 A1 | 2/2018 | Kishi et al. |

FOREIGN PATENT DOCUMENTS

| | | |
|---|---|---|
| JP | 2010-281874 A | 12/2010 |
| WO | 2014/141958 A1 | 9/2014 |
| WO | 2015/093097 A1 | 6/2015 |
| WO | 2016/129463 A1 | 8/2016 |

*Primary Examiner* — Anthony Ho
(74) *Attorney, Agent, or Firm* — ScienBiziP, P.C.

(57) ABSTRACT

With respect to a display device having an external compensation function, a monitor time can be shortened without increasing the number of wiring lines. A pixel circuit in an i-th row and a j-th column includes an organic EL element (display element), a writing control transistor, a drive transistor, a monitor control transistor, and a holding capacitor. A control terminal of the drive transistor is connected to a data signal line S(j) in the j-th column via the write control transistor. The monitor control transistor includes a first conduction terminal connected to a second conduction terminal of the drive transistor, and a second conduction terminal connected to a data signal line S(j+1) in a (j+1)-th column.

20 Claims, 26 Drawing Sheets

DISPLAY DEVICE AND METHOD FOR DRIVING SAME

TECHNICAL FIELD

The following disclosure relates to a display device and a driving method thereof, and more specifically, relates to a display device including a pixel circuit including a display element (for example, an organic EL element) whose luminance is controlled by a current and to a driving method thereof.

BACKGROUND ART

Organic EL display devices including pixel circuits including organic EL elements have recently been coming into practical use. The organic EL element is also called an Organic Light-Emitting Diode (OLED) and is a self-luminous display element that emits light at luminance corresponding to a current flowing therethrough. As described above, since the organic EL element is a self-luminous display element, the organic EL display device can be easily thinned in size, reduced in power consumption, increased in luminance, and the like, as compared with a liquid crystal display device requiring backlights, color filters, and the like.

In an active matrix organic EL display device, a plurality of pixel circuits are formed in a matrix shape. Each pixel circuit includes a drive transistor that controls a current supply to the organic EL element. A thin film transistor (TFT) is typically used as the drive transistor. However, the threshold voltage of the thin film transistor changes due to degradation. Since a large number of the drive transistors are provided in a display portion of the organic EL display device and the degree of deterioration differs for each drive transistor, variations occur in the threshold voltage. As a result, variations in luminance occur, and the display quality deteriorates. Furthermore, for the organic EL element, the current efficiency decreases with time. In other words, the luminance gradually decreases as time passes even in a case where a constant current is supplied to the organic EL element. As a result, image sticking occurs. As described above, in the active matrix organic EL display device, a processing of compensating for deterioration of the drive transistor and deterioration of the organic EL element has been performed in the related art.

An external compensation method is known as one of the methods of compensation processing. According to the external compensation method, a current flowing through the drive transistor or the organic EL element under a predetermined condition is measured by a circuit provided outside the pixel circuit. Then, an input image signal is corrected based on the measurement result. As a result, the deterioration of the drive transistor and the deterioration of the organic EL element are compensated for.

Note that in the following, a series of processings for measuring the current flowing through a circuit element (typically, the drive transistor and the organic EL element) under a predetermined condition in order to detect a characteristic of the circuit element in the pixel circuit is referred to as a "characteristic detection monitor", and the time required for the characteristic detection monitor is simply referred to as the "monitor time". Furthermore, a characteristic of the drive transistor provided in the pixel circuit is referred to as a "TFT characteristic", and a characteristic of the organic EL element provided in the pixel circuit is referred to as an "OLED characteristic". Furthermore, applying of a desired potential (voltage) to a data signal line to charge a holding capacitor in the pixel circuit is referred to as "writing".

An invention related to an organic EL display device employing an external compensation method such as that described above is disclosed in, for example, WO 2014/141958 pamphlet. In the organic EL display device disclosed in WO 2014/141958 pamphlet, each pixel circuit and a source driver are connected to each other by a data signal line and a monitor line. In performing the characteristic detection monitor, writing based on the characteristic detection potential is performed via the data signal line, and the current flowing through the monitor line is measured by a circuit provided outside the pixel circuit. However, according to this configuration, since the monitor line is required separately from the data signal line, the number of wiring lines in the display portion is increased.

Thus, a configuration in which the data signal line and the monitor line are shared is disclosed in, for example, WO 2015/093097 pamphlet. In this configuration, an output circuit (an output circuit also serving as a current monitor circuit) having a function of applying a desired potential (voltage) to the data signal line and a function of obtaining data corresponding to a magnitude of the current flowing through the data signal line as monitor data is provided for each column (for each data signal line). FIG. 24 is a circuit diagram in the case where the data signal line and the monitor line are shared, illustrating configurations of the pixel circuit 900 in an i-th row and a j-th column and the output circuit 930 corresponding to the j-th column. The pixel circuit 900 includes one organic EL element 921 as the display element, three transistors T91 to T93 (a writing control transistor T91 for controlling writing to a capacitor C91, a drive transistor T92 for controlling current supply to the organic EL element 921, and a monitor control transistor T93 for controlling whether the TFT characteristic or the OLED characteristic is detected), and one capacitor C91 as the holding capacitor. The output circuit 930 includes an operational amplifier 931, a capacitor 932, a switch 933 whose state is controlled by a control signal S2, a switch 934 whose state is controlled by a control signal S1, and a switch 935 whose state is controlled by a control signal S0. With respect to FIG. 24, a scanning signal line in the i-th row is denoted by reference sign G(i), a monitor control line in the i-th row is denoted by reference sign M(i), and a data signal line in the j-th column is denoted by reference sign S(j).

In a configuration such as that described above, for example, the detection of the TFT characteristic for one row or the detection of the OLED characteristic for one row is performed in each vertical scanning period. Note that hereinafter, when focusing on an arbitrary vertical scanning period, a row in which the detection of the TFT characteristic or the OLED characteristic is performed is referred to as a "monitor row", and a row other than the monitor row is referred to as a "normal row". Furthermore, hereinafter, with respect to an arbitrary row, a period for performing a processing of the arbitrary row in the vertical scanning period is referred to as a "select period". Assuming that m scanning signal lines G(1) to G(m) are provided in the display portion, the scanning signal lines G(1) to G(m) are driven as illustrated in FIG. 25 in the vertical scanning period in which the i-th row is the monitor row. A select period L2 for a monitor row is longer than a select period L1 for a normal row. For the monitor row, a corresponding scanning signal is at a high level in the period of the first portion and the period of the last portion in the select period L2.

FIG. 26 is a signal waveform diagram for describing operations in a period in which the characteristic detection monitor is performed in the above-described configuration (hereinafter referred to as a "characteristic detection period"). In FIG. 26, periods t1 to t6 are the characteristic detection period. The characteristic detection period corresponds to the select period L2 for the monitor row. Hereinafter, operations for each of the periods t1 to t6 during the characteristic detection period will be described.

In the period t1, the control signals S2 and S1 are at the high level, and the control signal S0 is at the low level. Thus, the switches 933 and 934 are in the on state and the switch 935 is in the off state. At this time, the data signal line S(j) and an internal data line Sin(j) of the output circuit 930 are electrically connected to each other. In the period t1, the scanning signal G(i) and the monitor control signal M(i) are maintained at the high level. Thus, the writing control transistor T91 and the monitor control transistor T93 are maintained in the on state. In the state described above, an initialization potential Vpc is applied to the data signal line S(j). As a result, the state of the capacitor C91 and an anode potential of the organic EL element 921 are initialized.

In the period t2, the monitor control signal M(i) is changed from the high level to the low level. This turns the monitor control transistor T93 to the off state. In this state, a characteristic detection potential Vr_TFT or a characteristic detection potential Vr_OLED is applied to the data signal line S(j). When the characteristic detection potential Vr_TFT is applied to the data signal line S(j), the drive transistor T92 is turned to the on state, and when the characteristic detection potential Vr_OLED is applied to the data signal line S(j), the drive transistor T92 is maintained in the off state.

In the period t3, the scanning signal G(i) changes from the high level to the low level, and the monitor control signal M(i) changes from the low level to the high level. This turns the writing control transistor T91 to the off state and turns the monitor control transistor T93 to the on state. In this state, a current measurement potential Vm_TFT or a current measurement potential Vm_OLED is applied to the data signal line S(j). As a result, when the measurement of the TFT characteristic is performed, a current flowing through the drive transistor T92 flows to the output circuit 930 via the monitor control transistor T93 and the data signal line S(j), and when the measurement of the OLED characteristic is performed, a current flows from the output circuit 930 to the organic EL element 921 via the data signal line S(j) and the monitor control transistor T93. At this time, since the control signal S2 is at the high level, the switch 933 is in the on state and no charge is accumulated in the capacitor 932.

In the period t4, the control signal S2 changes from the high level to the low level. This turns the switch 933 to the off state, and the operational amplifier 931 and the capacitor 932 function as an integration circuit. As a result, the output voltage of the operational amplifier 931 is a voltage corresponding to the current flowing through the data signal line S(j).

In the period t5, the control signal S1 is changed from the high level to the low level, and the control signal S0 is changed from the low level to the high level. This turns the switch 934 to the off state and turns the switch 935 to the on state. By the switch 934 being turned to the off state, the data signal line S(j) and the internal data line Sin(j) enter a state of being electrically disconnected from each other. In this state, the output voltage of the operational amplifier 931 (charging voltage of the capacitor 932) is converted to a digital signal by an A/D converter 924. The digital signal is transmitted to a display control circuit and is used to correct the input image signal.

In the period t6, the control signals S2 and S1 are changed from the low level to the high level, and the control signal S0 is changed from the high level to the low level. This turns the switches 933 and 934 to the on state and turns the switch 935 to the off state. In this state, a data potential Vd(i) for image display is applied to the data signal line S(j), and writing based on the data potential Vd(i) is performed in the pixel circuit 900 in the i-th row and the j-th column. In the period t10 and subsequent periods, in the pixel circuit 900 in the i-th row and the j-th column, the organic EL element 921 emits light based on the writing in the period t6.

In the organic EL display device having the configuration in which the data signal line and the monitor line are shared, the characteristic detection monitor is performed as described above. Note that hereinafter, processings performed to obtain one monitor data such as the processings performed in the above-described periods t1 to t5 are referred to as "unit monitor processing". Typically, the above periods t1 to t5 are repeated four times during one characteristic detection period (select period L2), and the detection of the TFT characteristic and the detection of the OLED characteristic are each performed two times. In other words, the unit monitor processing is repeatedly performed four times during the one characteristic detection period.

CITATION LIST

Patent Literature

PTL 1: WO 2014/141958 Pamphlet
PTL 2: WO 2015/093097 Pamphlet

SUMMARY

Technical Problem

However, according to the above-described configuration in which the data signal line and the monitor line are shared, after the end of the application of the characteristic detection potential (Vr_TFT or Vr_OLED) to a data signal line S, the current measurement potential (Vm_TFT or Vm_OLED) must be applied to the data signal line S. Furthermore, in a case where the unit monitor processing is repeatedly performed during the one characteristic detection period, providing a period of sufficient length to stabilize a measurement current (period t3 in FIG. 26) is required for each unit monitor processing. As a result, the monitor time is increased. According to the configuration in which the monitor line is provided separately from the data signal line, since the desired electrical potentials can be applied to the data signal line and the monitor line respectively, the monitor time is short, but the number of wiring lines in the display portion is increased.

Thus, the following disclosure relates to a display device having an external compensation function, and is intended to achieve shortening of the monitor time without increasing the number of wiring lines.

Solution to Problem

A display device according to some embodiments of the present disclosure includes a plurality of data signal lines, a plurality of scanning signal lines, a plurality of monitor control lines corresponding to the plurality of scanning signal lines on a one-to-one basis, and pixel circuits of m rows n columns (where m and n are integers of 2 or more) provided corresponding to intersections of the plurality of data signal lines and the plurality of scanning signal lines and including a display element whose luminance is controlled by a current and a drive transistor for controlling a current to be supplied to the display element, the display device having a function of detecting a characteristic of the drive transistor, wherein the display device includes a data signal line drive circuit that applies a data signal to the plurality of data signal lines, a scanning signal line drive circuit that applies a scanning signal to the plurality of scanning signal lines, and a monitor control line drive circuit that applies a monitor control signal to the plurality of monitor control lines, the data signal line drive circuit has a function of measuring a current flowing through each data signal line, and a pixel circuit in an i-th row and a j-th column (where i is an integer of 1 or more and m or less, and j is an integer of 1 or more and n or less) includes the display element provided between a first power supply voltage line supplied with a first supply voltage and a second power supply voltage line supplied with a second supply voltage, and including a first terminal and a second terminal connected to the second power supply voltage line, the drive transistor including a control terminal, a first conduction terminal connected to the first power supply voltage line, and a second conduction terminal, a writing control transistor including a control terminal connected to a scanning signal line in the i-th row, a first conduction terminal connected to a data signal line in the j-th column, and a second conduction terminal connected to the control terminal of the drive transistor, and a monitor control transistor including a control terminal connected to a monitor control line in the i-th row, a first conduction terminal connected to the second conduction terminal of the drive transistor and a second conduction terminal connected to a data signal line in a (j+1)-th column.

A driving method (of a display device) according to some embodiments of the present disclosure, the display device including a plurality of data signal lines, a plurality of scanning signal lines, and pixel circuits of m rows×n columns (where m and n are integers of 2 or more) provided corresponding to intersections of the plurality of data signal lines and the plurality of scanning signal lines, and the display device having a function of detecting a characteristic of a circuit element included in each pixel circuit, the driving method including an initialization potential application step of applying an initialization potential for initializing the state of the pixel circuit to the data signal line a characteristic detection potential application step of applying a characteristic detection potential as a data signal for detecting the characteristic of the circuit element to the data signal line, a current measurement potential application step of applying a current measurement potential as a data signal for measuring a current representative of a characteristic of the circuit element to the data signal line, a current measurement charging step of performing current measurement charging based on a current flowing through the data signal line, and an A/D conversion step of performing A/D conversion based on a charging voltage obtained in the current measurement charging step, wherein at least two of the initialization potential application step, the characteristic detection potential application step, the current measurement potential application step, the current measurement charging step, and the A/D conversion step are started at the same timing.

Advantageous Effects of Disclosure

According to some embodiments of the present disclosure, a control terminal of a drive transistor included in the pixel circuit in the i-th row is connected to the data signal line in the j-th column via the write control transistor, and a second conduction terminal of the drive transistor is connected to the data signal line in the (j+1)-th column via the monitor control transistor. Thus, when the characteristic of the drive transistor included in each pixel circuit is detected, two adjacent data signal lines can be used as a write line (signal line for supplying a potential for writing to the pixel circuit) and a read line (signal line serving as a path for the measurement current). As a result, the processing of applying the desired potential to the write line and the processing of applying the desired potential to the read line can be performed in parallel, and the monitor time is shortened compared to the configuration in the related art.

DESCRIPTION OF EMBODIMENTS

Embodiments will be described below with reference to the accompanying drawings. In the following description, it is assumed that m and n are an integer of 2 or more, i is an integer of 1 or more and m or less, and j is an integer of 1 or more and n or less.

1. First Embodiment

1.1 Overall Configuration and Operation Outline

Figure 2:
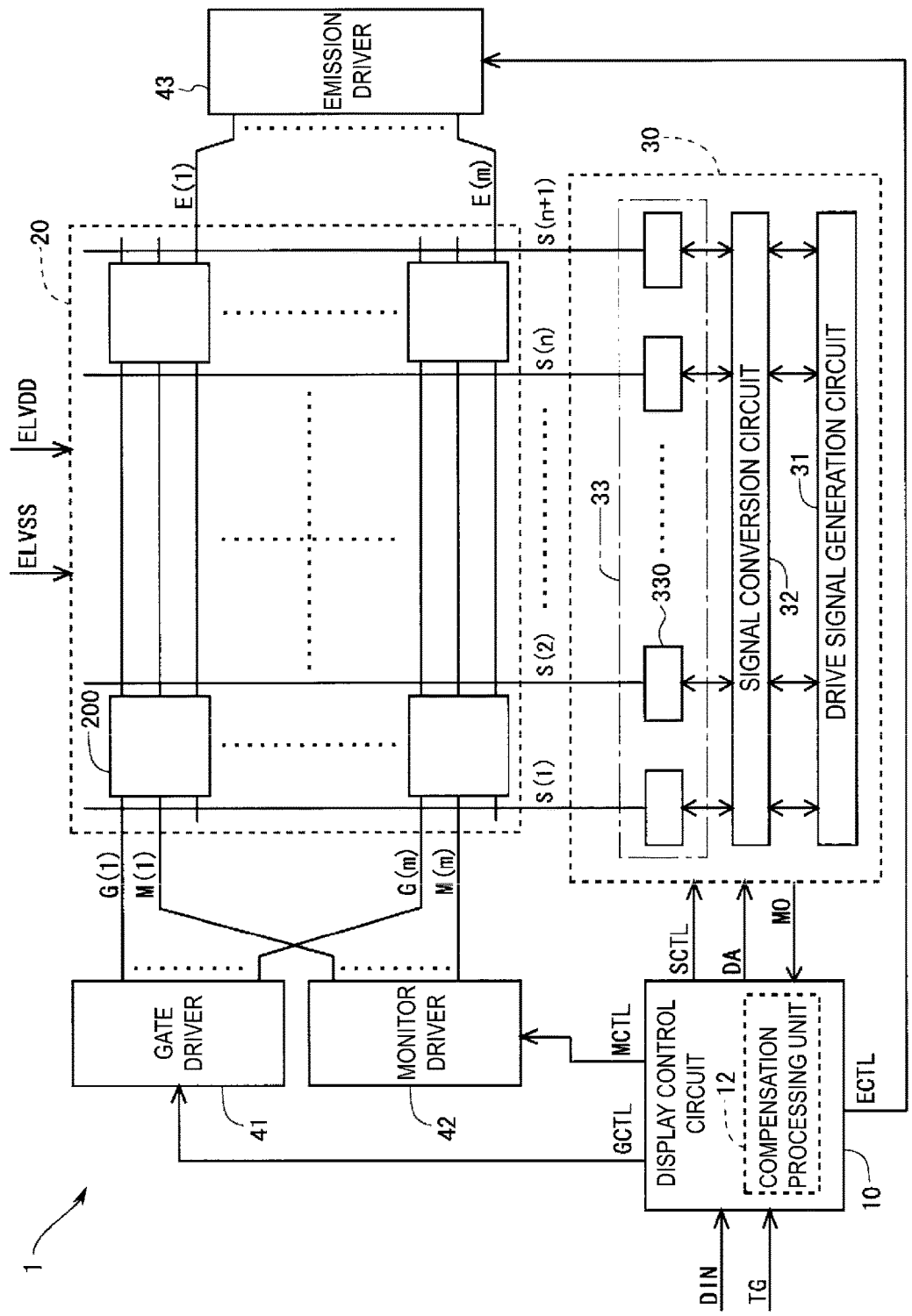
FIG. 2 is a block diagram illustrating an overall configuration of an active-matrix organic EL display device according to the first embodiment.

FIG. 2 is a block diagram illustrating an overall configuration of an active-matrix organic EL display device 1 according to the first embodiment. The organic EL display device 1 includes a display control circuit 10, a display portion 20, a source driver (data signal line drive circuit) 30, a gate driver (scanning signal line drive circuit) 41, a monitor driver (monitor control line drive circuit) 42, and an emission driver 43. Typically, the gate driver 41, monitor driver 42, and the emission driver 43 are formed to be monolithic. However, a configuration may also be used in which these drivers are not formed to be monolithic. The display control circuit 10 includes a compensation processing unit 12 that compensates for deterioration of drive transistors and organic EL elements.

In the display portion 20, (n+1) data signal lines S(1) to S(n+1) and m scanning signal lines G(1) to G(m) orthogonal to the data signal lines are arranged. In the display portion 20, m monitor control lines M(1) to M(m) are also arranged to correspond to the m scanning signal lines G(1) to G(m) on a one-to-one basis. Furthermore, in the display portion 20, m light emission control lines E(1) to E(m) are also arranged to correspond to the m scanning signal lines G(1) to G(m) on a one-to-one basis. The scanning signal lines G(1) to G(m), the monitor control lines M(1) to M(m), and the light emission control lines E(1) to E(m) are typically parallel to each other. Furthermore, in the display portion 20, m×n pixel circuits (pixel circuits of m rows×n columns) 200 are provided to correspond to intersections between the scanning signal lines G(1) to G(m) and the data signal lines S(1) to S(n). As a result, a pixel matrix of the m rows×n columns is formed in the display portion 20.

Note that in the following description, when necessary, scanning signals respectively supplied to the scanning signal lines G(1) to G(m) are also denoted by reference signs G(1) to G(m), monitor control signals respectively supplied to the monitor control lines M(1) to M(m) are also denoted by reference signs M(1) to M(m), and light emission control signals respectively supplied to the light emission control lines E(1) to E(m) are also denoted by reference signs E(1) to E(m).

In the present embodiment, although n pixel circuits 200 are provided for each row, (n+1) data signal lines S(1) to S(n+1) are arranged in the display portion 20. In other words, the number of provided data signal lines is greater than the number of pixel circuits 200 per row by one. This reason is as follows. The data signal line in the present embodiment is used not only as a signal line (hereinafter referred to as "write line") for supplying a potential (voltage) for writing to the pixel circuit 200, but also as a signal line (hereinafter referred to as "read line") for serving as a path for a current (measurement current) representative of the TFT characteristic and the OLED characteristic. Here, with respect to an arbitrary pixel circuit 200, a data signal line positioned on the left side of the pixel circuit 200 in FIG. 2 is used as the write line, and a data signal line positioned on the right side of the pixel circuit 200 in FIG. 2 is used as the read line. In other words, for the pixel circuit 200 in the first column, the data signal line S(1) is used as the write line and the data signal line S(2) is used as the read line, and for the pixel circuit 200 in the j-th column (where j is an integer of 2 or more and n−1 or less), the data signal line S(j) is used as the write line and the data signal line S(j+1) is used as the read line, and for the pixel circuit 200 in the n-th column, the data signal line S(n) is used as the write line and the data signal line S(n+1) is used as the read line. In order to achieve the above-described configuration, the number of provided data signal lines is greater than the number of pixel circuits 200 per row by one. Note that the data signal line S(1) is used only as the write line, and the data signal line S(j+1) is used only as the read line.

In the display portion 20, power source lines (not illustrated) which are common to each of the pixel circuits 200 are also arranged. To be more specific, a power source line which supplies a high-level power supply voltage ELVDD for driving the organic EL element (hereinafter, referred to as "high-level power source line") and a power source line which supplies a low-level power supply voltage ELVSS for driving the organic EL element (hereinafter, referred to as "low-level power source line") are arranged. The high-level power supply voltage ELVDD and the low-level power supply voltage ELVSS are supplied from a power source circuit (not illustrated). Note that in the present embodiment, a first power supply voltage is realized by the high level power source voltage ELVDD, a first power source voltage line is realized by a high level power source line, a second power supply voltage is realized by the low level power source voltage ELVSS, and a second power source voltage line is realized by a low level power source line. However, in the present embodiment, the first power supply voltage may be realized by the low level power source voltage ELVSS, the first power source voltage line may be realized by the low level power source line, the second power supply voltage may be realized by the high level power source voltage ELVDD, and the second power source voltage line is realized by the high level power source line.

The display control circuit 10 receives an input image signal DIN and a timing signal group (a horizontal synchronization signal, a vertical synchronization signal, and the like) TG transmitted from the outside, and outputs a data signal DA, a source control signal SCTL for controlling the operations of a source driver 30, a gate control signal GCTL for controlling the operations of a gate driver 41, a monitor driver control signal MCTL for controlling the operations of a monitor driver 42, and an emission driver control signal ECTL for controlling the operations of an emission driver 43. Note that the data signal DA for image display is generated by the compensation processing unit 12 performing a compensation operation on the input image signal DIN in accordance with the monitor data (data measured for obtaining the TFT characteristic and the OLED characteristic) MO supplied from the source driver 30.

The gate driver 41 is connected to the scanning signal lines G(1) to G(m). The gate driver 41 applies scanning signals to the scanning signal lines G(1) to G(m), based on the gate control signal GCTL output from the display control circuit 10. The monitor driver 42 is connected to the monitor control lines M(1) to M(m). The monitor driver 42 applies monitor control signals to the monitor control lines M(1) to M(m), based on the monitor driver control signal MCTL output from the display control circuit 10. The emission driver 43 is connected to the light emission control lines E(1) to E(m). The emission driver 43 applies light emission control signals to the emission control lines E(1) to E(m), based on the emission driver control signal ECTL output from the display control circuit 10.

In the organic EL display device 1, a characteristic detection monitor is performed to compensate for the deterioration of the drive transistors and the organic EL element. With respect to this, in the present embodiment, the detection of the TFT characteristic is performed during the vertical scanning period in which the display operation is performed, and the detection of the OLED characteristic is performed when the power is turned on or off. More specifically, the detection of the TFT characteristic for one row is performed in each vertical scanning period, and the detection of the OLED characteristic for a plurality of rows is intensively performed when the power is turned on or off.

The source driver 30 is connected to the data signal lines S(1) to S(n+1). The source driver 30 is constituted by a drive signal generation circuit 31, a signal conversion circuit 32, and an output unit 33 constituted by (n+1) output circuits 330 also serving as current monitor circuits. Each output circuit 330 is connected to a corresponding data signal line S.

The drive signal generation circuit 31 includes a shift register, a sampling circuit, and a latch circuit. In the drive signal generation circuit 31, the shift register sequentially transfers pulses included in a source start pulse signal from an input end to an output end in synchronization with a source clock signal. In response to this pulse transferring, a sampling pulse corresponding to each data signal line S is output from the shift register. The sampling circuit sequentially stores the data signals DA for one row in accordance with a timing of the sampling pulse. The latch circuit obtains and holds the data signals DA for one row stored in the sampling circuit in accordance with a latch strobe signal. Note that in the present embodiment, the data signal DA includes a luminance signal (i.e., a signal for image display) for causing the organic EL element in the pixel circuit 200 to emit light at a desired luminance, and a control signal for controlling the operation of the pixel circuit 200 when the TFT characteristic and the OLED characteristic are detected.

The signal conversion circuit 32 includes a D/A converter and an A/D converter. As described above, the data signals DA for one row held in the latch circuit in the drive signal generation circuit 31 is converted to an analog voltage by the D/A converter in the signal conversion circuit 32. The converted analog voltage is supplied to the output circuit 330 in the output unit 33. The monitor data MO is supplied from the output circuit 330 in the output unit 33 to the signal conversion circuit 32. The monitor data MO is converted from the analog voltage to the digital signal by the A/D converter in the signal conversion circuit 32. The monitor data MO converted to the digital signal is supplied to the display control circuit 10 via the drive signal generation circuit 31.

Figure 3:
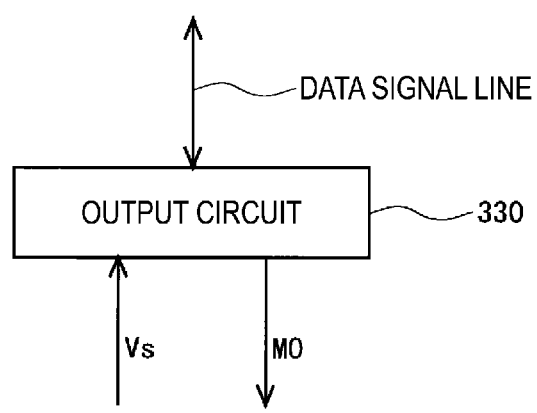
FIG. 3 is a diagram for describing input/output signals of an output circuit (an output circuit also serving as a current monitor circuit) in an output unit in the first embodiment.

FIG. 3 is a diagram for explaining the input/output signals of the output circuit 330 in the output unit 33. An analog voltage Vs as the data signal DA is supplied from the signal conversion circuit 32 to the output circuit 330. The analog voltage Vs is applied to the data signal line S via a buffer in the output circuit 330. The output circuit 330 has a function of acquiring the magnitude of a current flowing through the data signal line S as analog data (analog voltage) and a function of holding a value of the analog data obtained at a certain timing throughout a period in which the A/D conversion is being performed, (i.e., the sample and hold function). The data obtained in the output circuit 330 is supplied to the signal conversion circuit 32 as the monitor data MO. Note that a detailed configuration of the output circuit 330 will be described later (see FIG. 4).

As described above, by applying the scanning signals to the scanning signal lines G(1) to G(m), applying the monitor control signals to the monitor control lines M(1) to M(m), applying the light emission control signals to the light emission control lines E(l) to E(m), and applying the data signals as the luminance signals to the data signal lines S(1) to S(n), an image based on the input image signal DIN is displayed on the display portion 20. In addition, since the characteristic detection monitor is performed and the input image signal DIN is subjected to the compensation calculation processing in accordance with the monitor data MO, the deterioration of the drive transistors and the organic EL element is compensated.

1.2 Pixel Circuit and Data Signal Line

A configuration of the pixel circuit 200 will be described while referring to FIG. 1. Note that although the pixel circuit 200(i, j) in the i-th row and the j-th column and the pixel circuit 200(i, j+1) in the i-th row and the (j+1)-th column are illustrated in FIG. 1, the pixel circuit 200(i, j) in the i-th row and the j-th column is focused here.

Figure 1:
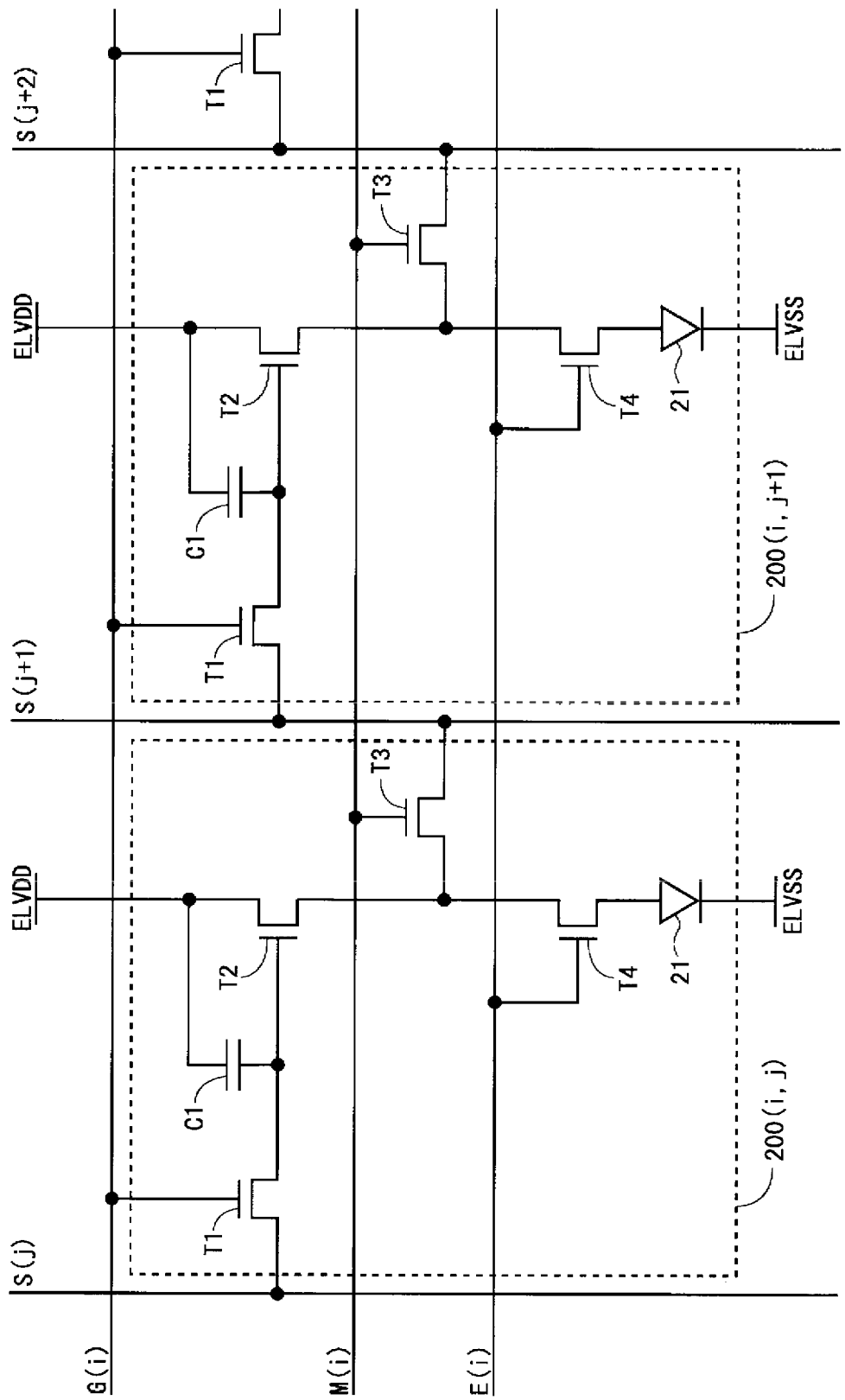
FIG. 1 is a circuit diagram illustrating a configuration of a pixel circuit in a first embodiment.

As illustrated in FIG. 1, the pixel circuit 200(i, j) includes one organic EL element 21 as the display element, four transistors T1 to T4 (a writing control transistor T1 for controlling writing to a capacitor C1, a drive transistor T2 for controlling current supply to the organic EL element 21, and a monitor control transistor T3 for controlling whether the TFT characteristic or the OLED characteristic is detected, and a light emission control transistor T4 for controlling whether the organic EL element emits light), and one capacitor C1 as a holding capacitor. In the present embodiment, the transistors T1 to T4 are n-channel thin film transistors.

The first writing control transistor T1 includes a control terminal connected to the scanning signal line G(i), a first conduction terminal connected to the data signal line S(j), and a second conduction terminal connected to the control terminal of the drive transistor T2 and one end of the capacitor C1. The drive transistor T2 includes a control terminal connected to the second conduction terminal of the writing control transistor T1 and one end of the capacitor C1, a first conduction terminal connected to another the end of the capacitor C1 and the high level power source line, and a second conduction terminal connected to the first conduction terminal of the monitor control transistor T3 and the first conduction terminal of the light emission control transistor T4. The monitor control transistor T3 includes a control terminal connected to the monitor control line M(i), a first conduction terminal connected to the second conduction terminal of the drive transistor T2 and the first conduction terminal of the light emission control transistor T4, and a second conduction terminal connected to the data signal line S(j+1). The light emission control transistor T4 includes a control terminal connected to the emission control line E(i), a first conduction terminal connected to the second conduction terminal of the drive transistor T2 and the first conduction terminal of the monitor control transistor T3, and a second conduction terminal connected to the anode terminal of the organic EL element 21. The capacitor C1 includes one end connected to the second conduction terminal of the writing control transistor T1 and the control terminal of the drive transistor T2, and the other end connected to the first conduction terminal of the drive transistor T2 and the high level power source line. The organic EL element 21 includes an anode terminal connected to the second conduction terminal of the light emission control transistor T4, and a cathode terminal connected to the low level power source line. In the present embodiment, one end of the capacitor C1 corresponds to the first electrode, the other end of the capacitor C1 corresponds to the second electrode, the anode terminal of the organic EL element 21 corresponds to the first terminal, and the cathode terminal of the organic EL element 21 corresponds to the second terminal.

Note that the other end of the capacitor C1 may be connected to the second conduction terminal of the drive transistor T2, the first conduction terminal of the monitor control transistor T3, and the first conduction terminal of the emission control transistor T4, or may be connected to the low level power source line. Furthermore, a configuration in which the light emission control transistor T4 is not provided can be employed.

Note that for example, an oxide TFT (a thin film transistor using an oxide semiconductor for a channel layer) or an amorphous TFT can be employed for the transistors T1 to T4 in the pixel circuit 200(i, j). Examples of the oxide TFT include, for example, a TFT containing indium gallium zinc oxide (InGaZnO). By employing the oxide TFT, it is possible to achieve high definition and low power consumption, for example.

In the pixel circuit 200(i, j), as described above, the first conduction terminal of the writing control transistor T1 is connected to the data signal line S(j), and the second conduction terminal of the monitor control transistor T3 is connected to the data signal line S(j+1). Thus, for the pixel circuit 200(i, j), the data signal line S(j) is used as the write line, and the data signal line S(j+1) is used as the read line.

1.3 Output Circuit (Output Circuit Also Serving as a Current Monitor Circuit)

Next, a configuration and operations of the output circuit 330 will be described in detail while referring to FIG. 4. Note that in FIG. 4, although the output circuit 330 corresponding to the data signal line S(j), the output circuit 330 corresponding to the data signal line S(j+1) and the pixel circuit 200(i, j) in the i-th row and the j-th column. the output circuit 330 corresponding to the data signal line S(j) is focused on here.

Figure 4:
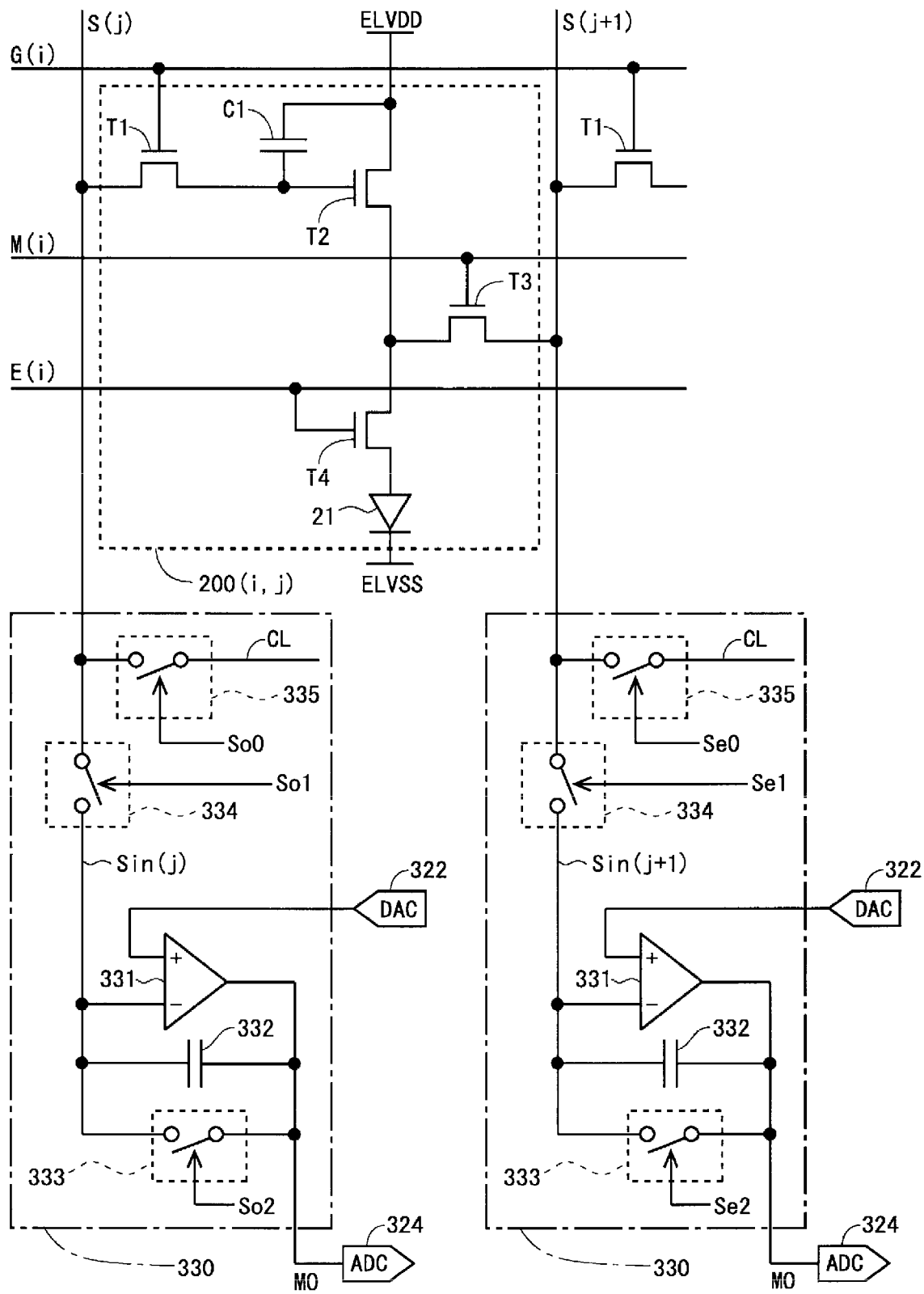
FIG. 4 is a circuit diagram illustrating a configuration of the output circuit in the first embodiment.

As illustrated in FIG. 4, the output circuit 330 includes an operational amplifier 331, a capacitor 332, and three switches (switches 333, 334, and 335). The internal data line Sin(j) of the output circuit 330 is connected to the data signal line S(j) via the switch 334. The operational amplifier 331 includes an inverting input terminal connected to the internal data line Sin(j), and a non-inverting input terminal to which the output from the D/A converter 322 is supplied. The capacitor 332 and the switch 333 are provided between the output terminal of the operational amplifier 331 and the internal data line Sin(j). A control signal So2 is supplied to the switch 333. The operational amplifier 331, the capacitor 332, and the switch 333 constitute an integration circuit. Operations of the integration circuit will now be described. When the switch 333 is in the on state, the output terminal and the inverting input terminal of the operational amplifier 331 (i.e., between two electrodes of the capacitor 332) are in a short circuit state. At this time, no charge is accumulated in the capacitor 332, and the potential of the output terminal of the operational amplifier 331 and the internal data line Sin(j) are equal to the output potential from the D/A converter 322. When the switch 333 is switched from the on state to the off state, charging to the capacitor 332 is performed based on a current flowing through the internal data line Sin(j). In other words, the time integral value of the current flowing through the internal data line Sin(j) is accumulated in the capacitor 332. As a result, the potential of the output terminal of the operational amplifier 331 changes depending on the magnitude of the current flowing through the internal data line Sin(j). The output from the operational amplifier 331 is transmitted, as the monitor data MO, to an A/D converter 324 in the signal conversion circuit 32.

The switch 334 is provided between the data signal line S(j) and the internal data line Sin(j). A control signal So1 is supplied to the switch 334. By switching the state of the switch 334 based on the control signal So1, an electrical connection state between the data signal line S(j) and the internal data line Sin(j) is controlled. In the present embodiment, when the control signal So1 is at the high level, the data signal line S(j) and the internal data line Sin(j) enter a state of being electrically connected to each other, and when the control signal So1 is at the low level, the data signal line S(j) and the internal data line Sin(j) enter a state of being electrically disconnected from each other.

The switch 335 is provided between the data signal line S(j) and a control line CL. A control signal So0 is supplied to the switch 335. By switching the state of the switch 335 based on the control signal So0, the electrical connection state between the data signal line S(j) and the control line CL is controlled. In the present embodiment, when the control signal So0 is at the high level, the data signal line S(j) and the control line CL enter a state of being electrically connected to each other, and when the control signal So0 is at the low level, the data signal line S(j) and the control line CL enter a state of being electrically disconnected from each other. When the data signal line S(j) and the control line CL are electrically connected to each other, the state of the data signal line S(j+1) becomes one of high impedance.

As described above, when the switch 334 is turned to the off state, the data signal line S(j) and the internal data line Sin(j) enter a state of being electrically disconnected from each other. At this time, when the switch 333 is in the off state, the potential of the internal data line Sin(j) is maintained. In the present embodiment, in a state in which the potential of the internal data line Sin(j) is maintained as described above, A/D conversion by the A/D converter 324 in the signal conversion circuit 32 is performed.

Note that in the present embodiment, a current measuring unit is realized by the output circuit 330 and the A/D converter 324.

1.4 Driving Method

Next, a driving method related to the performance of the characteristic detection monitor will be described. As described above, in the present embodiment, the TFT characteristic is detected for one row in each vertical scanning period. In each vertical scanning period, normal operations for the image display are performed in the normal row and operations for the characteristic detection monitor are performed in the monitor row. As described above, in the present embodiment, the detection of the OLED characteristic for the plurality of rows is intensively performed when the power is turned on or off. In addition, in the present embodiment, the unit monitor processing is performed only once for one characteristic detection period. Operations when the detection of the TFT characteristic is performed and operations when the detection of the OLED characteristic is performed will be sequentially described below.

1.4.1 Detection of TFT Characteristic

Figure 5:
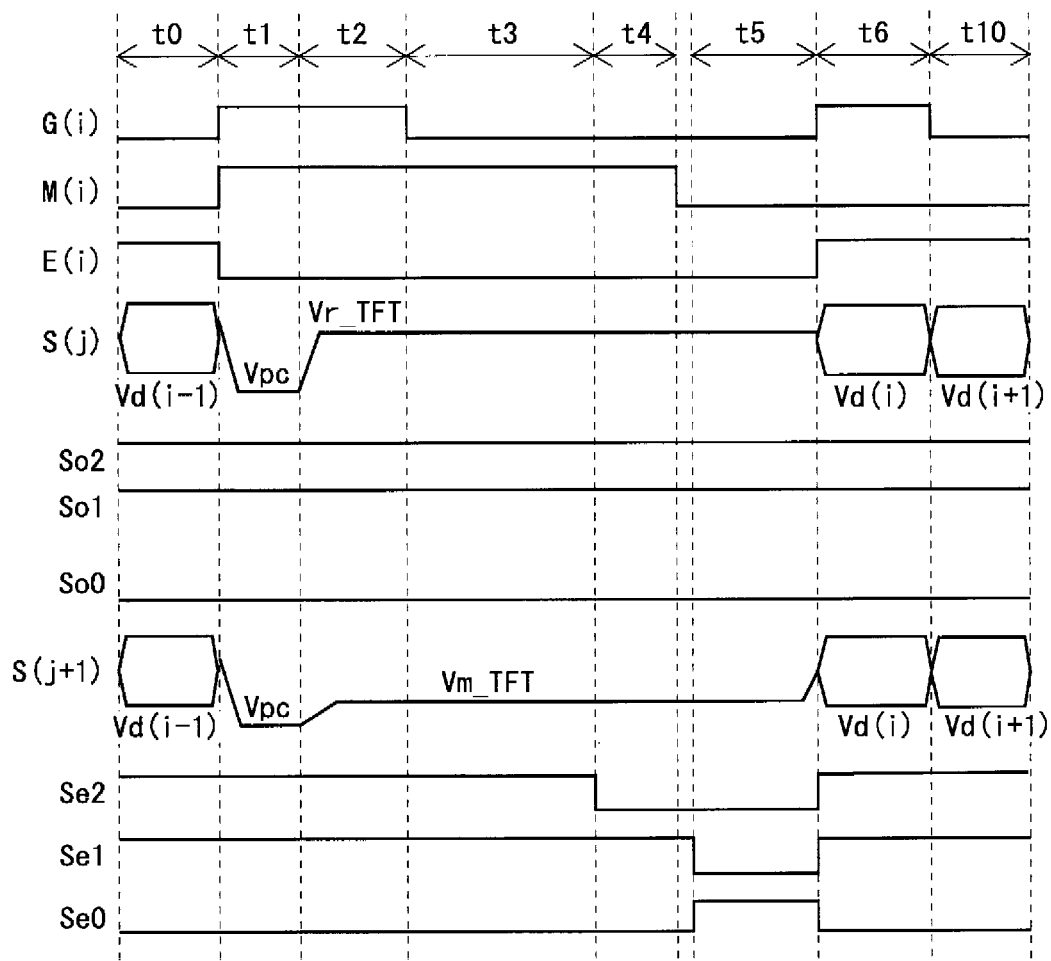
FIG. 5 is a signal waveform diagram when a TFT characteristic is detected in the first embodiment.

FIG. 5 is a signal waveform diagram when the TFT characteristic is detected. With respect to FIG. 5, the periods t1 to t6 are select periods for the monitor row, the period t0 is a select period for the normal row that is a previous row of the monitor row, and the period t10 is a select period for the normal row that is the next row of the monitor row. S(j) and S(j+1) represent the output potentials from the D/A converter 322 corresponding to the data signal lines in the j-th column and the (j+1)-th column, respectively. Here, assuming that the i-th row is the monitor row, and the pixel circuit 200(i, j) in the i-th row and the j-th column and the data signal lines in the j-th column and the (j+1)-th column will be focused. Note that the period from when the scanning signal line G(i−1) in the (i−1)-th row changes from the on state to the off state to when the scanning signal line G (i+1) in the (i+1)-th row changes from the off state to the on state is the select period in the i-th row, which is the monitor row.

In the period t0, writing is performed in the (i−1) row based on the data potential Vd(i−1) for image display. Immediately before the end of the period t0, the scanning signal G(i) and the monitor control signal M(i) are at the low level, and the light emission control signal E (i) is at the high level. Accordingly, the writing control transistor T1 and the monitor control transistor T3 are in the off state, and the emission control transistor T4 is in the on state. At this time, the drive transistor T2 is in the on state based on the writing in the last vertical scanning period. As described above, the organic EL element 21 emits light in accordance with the drive current. Immediately before the end of the period t0, the control signals Se2 and Se1 are at the high level, and the control signal Se0 is at the low level. Accordingly, in the output circuit 330 corresponding to the data signal line S(j+1), the switches 333 and 334 are in the on state and the switch 335 is in the off state.

Figure 6:
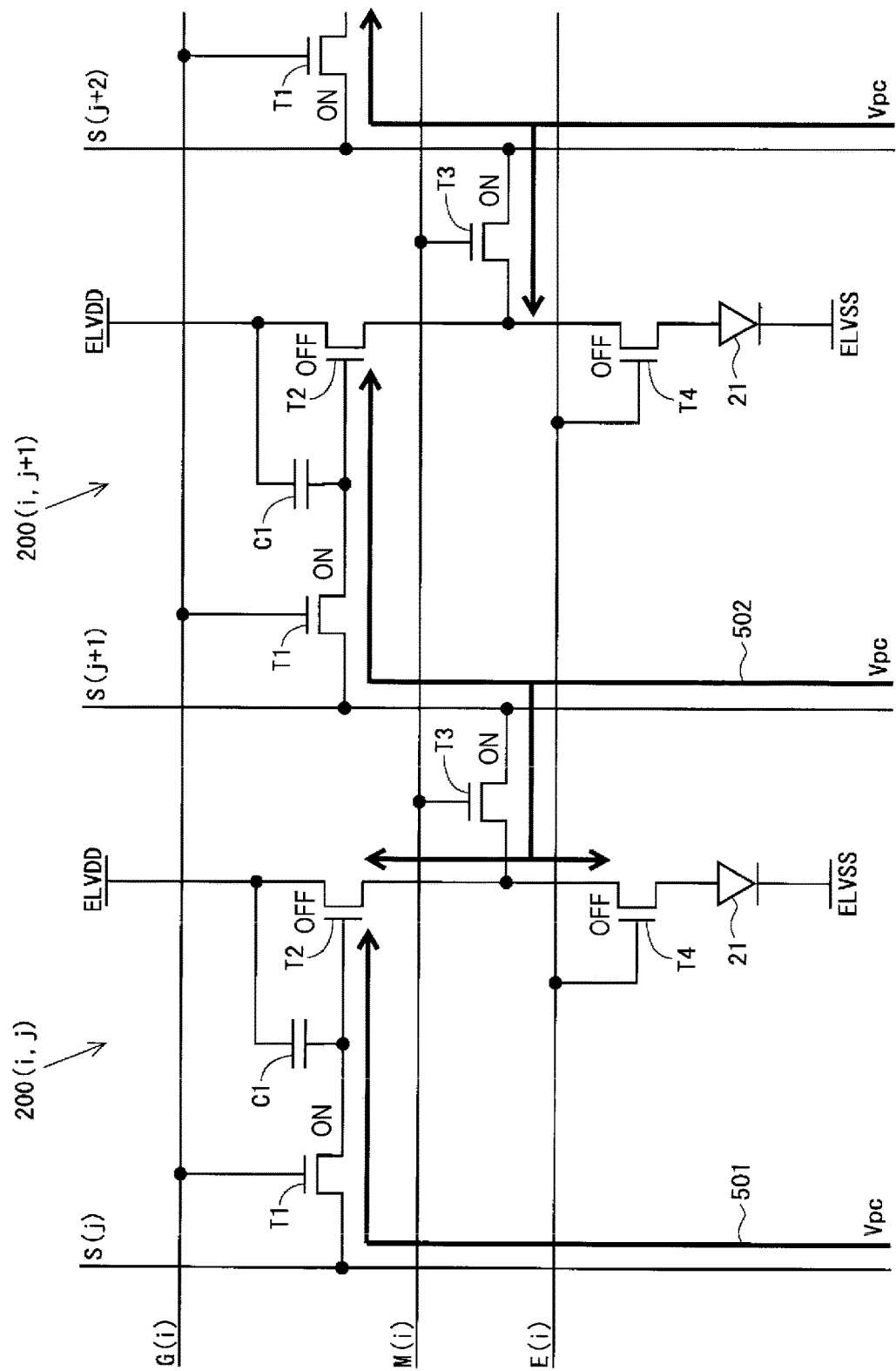
FIG. 6 is a diagram for describing operations when the TFT characteristic is detected in the first embodiment.

In the period t1, the scanning signal G(i) and the monitor control signal M(i) are changed from the low level to the high level, and the light emission control signal E (i) is changed from the high level to the low level. This turns the writing control transistor T1 and the monitor control transistor T3 to the on state and turns the emission control transistor T4 to the off state. By the light emission control transistor T4 being turned to the off state, the supply of the drive current to the organic EL element 21 is stopped, and the organic EL element 21 is turned off. In the period t1, the initialization potential Vpc that initializes the state of the pixel circuit 200 is applied to the data signal lines S(j) and S(j+1). As a result, as indicated by an arrow denoted by reference numeral 501 in FIG. 6, the state of the capacitor C1 is initialized based on the initialization potential Vpc, and as indicated by an arrow denoted by reference numeral 502 in FIG. 6, the anode potential of the organic EL element 21 is initialized based on the initialization potential Vpc.

Figure 7:
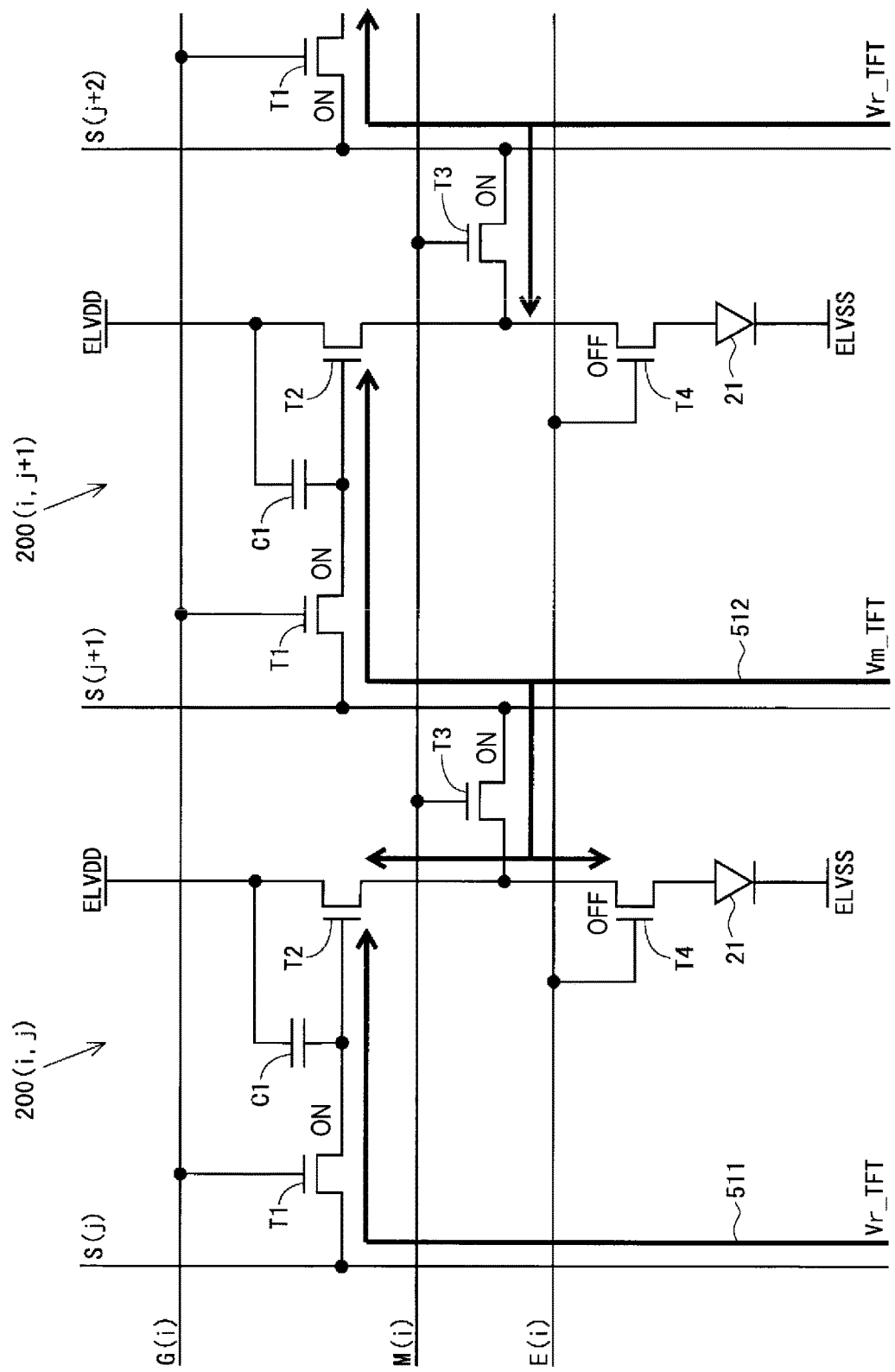
FIG. 7 is a diagram for describing operations when the TFT characteristic is detected in the first embodiment.

In the period t2, the characteristic detection potential Vr_TFT is applied to the data signal line S(j). As a result, as indicated by an arrow denoted by reference numeral 511 in FIG. 7, writing based on the characteristic detection potential Vr_TFT is performed. Note that the characteristic detection potential Vr_TFT is a potential such that the drive transistor T2 is turned to the on state and the organic EL element 21 is in the non-emitting state. In the period t2, the current measurement potential Vm_TFT is applied to the data signal line S(j+1). As a result, the anode potential of the organic EL element 21 and the potential of the data signal line S(j+1) change toward the current measurement potential Vm_TFT (see the arrow denoted by reference numeral 512 in FIG. 7). Note that the current measurement potential Vm_TFT is a potential such that the drive transistor T2 is turned to the on state and the organic EL element 21 is turned to the non-emitting state. The length of the period t2 is set such that the capacitor C1 is sufficiently charged based on the characteristic detection potential Vr_TFT.

Figure 8:
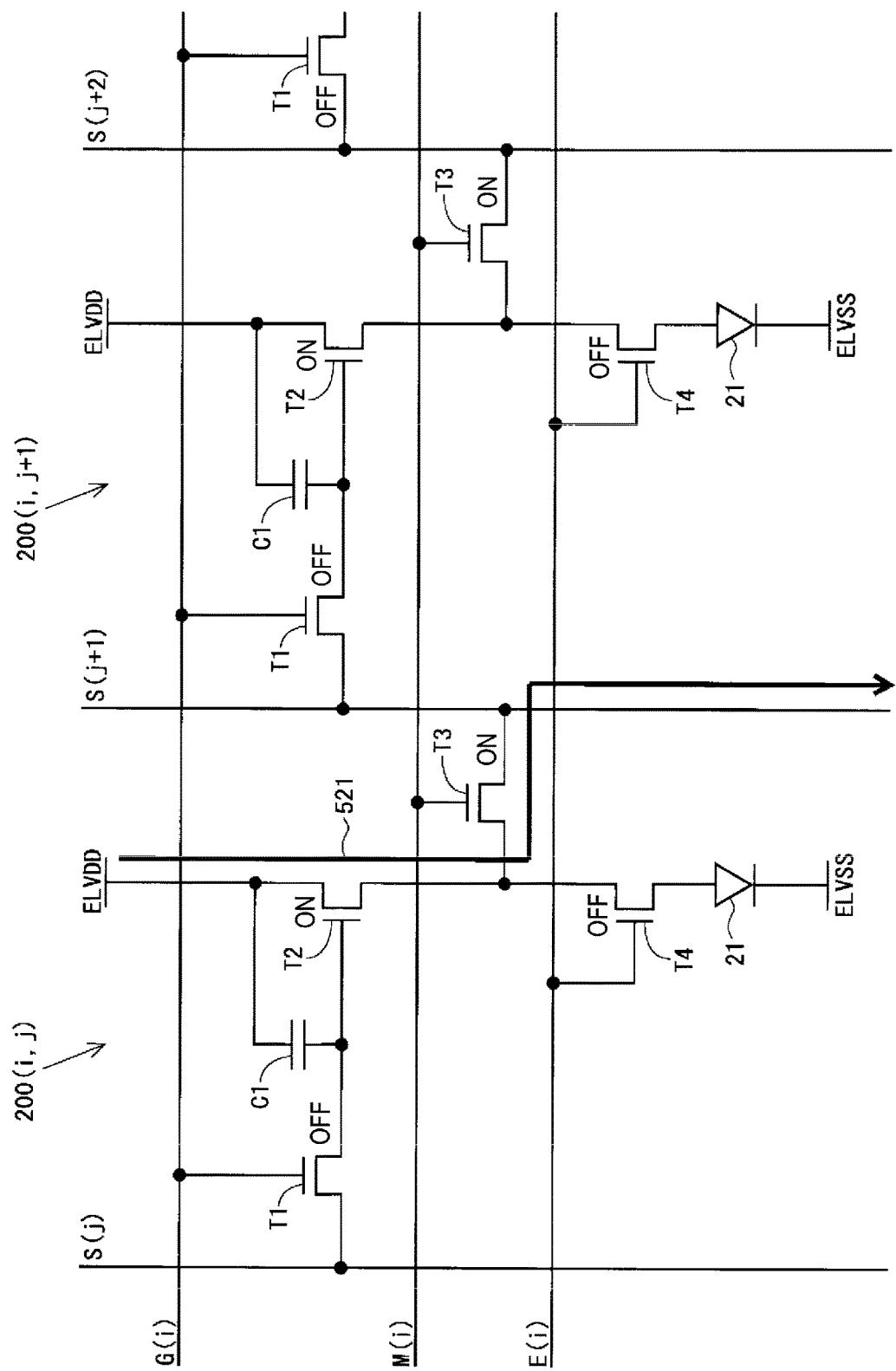
FIG. 8 is a diagram for describing operations when the TFT characteristic is detected in the first embodiment.

In the period t3, the scanning signal G(i) is changed from the high level to the low level. This turns the writing control transistor T1 to the off state, and the charging voltage of the capacitor C1 is determined. At this time, the drive transistor T2 is in the on state. The monitor control transistor T3 is maintained in the on state, and the emission control transistor T4 is maintained in the off state. As described above, as indicated by the arrow denoted by reference numeral 521 in FIG. 8, a current (measurement current) corresponding to the characteristic of the drive transistor T2 flows to the data signal line S(j+1) via the monitor control transistor T3. Note that the period t3 is set to a length sufficient for the measurement current flowing through the data signal S(j+1) to stabilize.

In the period t4, the control signal Se2 changes from the high level to the low level. As a result, in the output circuit 330 corresponding to the data signal line S(j+1), the switch 333 changes from the on state to the off state and the inverting input terminal and the output terminal of the operational amplifier 331 are connected to each other via the capacitor 332. At this time, the operational amplifier 331 and the capacitor 332 function as an integrated circuit. As a result, the output voltage of the operational amplifier 331 (charging voltage of the capacitor 332) is a voltage corresponding to the current flowing through the data signal line S(j+1).

Figure 9:
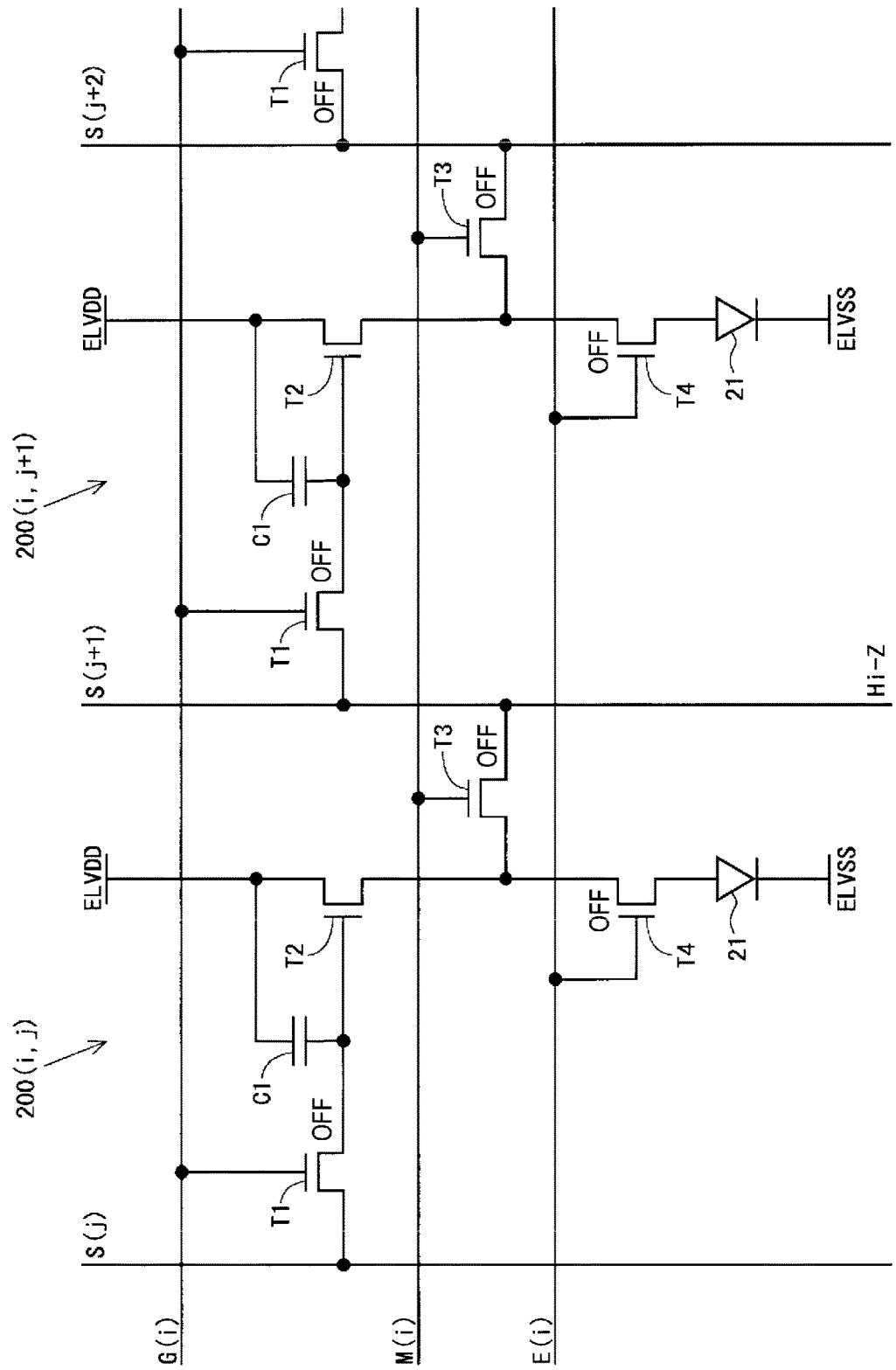
FIG. 9 is a diagram for describing operations when the TFT characteristic is detected in the first embodiment.

In the period t5, the control signal Se1 is changed from the high level to the low level, and the control signal Se0 is changed from the low level to the high level. As a result, in the output circuit 330 corresponding to the data signal line S(j+1), the switch 334 changes from the on state to the off state and the switch 335 changes from the off state to the on state. As a result, as illustrated in FIG. 9, the state of the data signal line S(j+1) becomes one of high impedance. By the switch 334 being turned to the off state, the potential of the internal data line Sin(j+1) immediately before the start of the period t5 is maintained. In this state, the output voltage as the monitor data MO of the operational amplifier 331 (charging voltage of the capacitor 332) is converted to a digital signal by the A/D converter 324. The converted monitor data MO is transmitted to the display control circuit 10 via the drive signal generation circuit 31, and is used for the compensation calculation processing in the compensation processing unit 12. Note that in the period t5, by the monitor control signal M(i) changing from the high level to the low level, the monitor control transistor T3 is turned to the off state.

In the period t6, the control signals Se2 and Se1 are changed from the low level to the high level, and the control signal Se0 is changed from the high level to the low level. This turns the switches 333 and 334 to the on state and turns the switch 335 to the off state, in the output circuit 330 corresponding to the data signal line S(j+1). At this time, also in the output circuit 330 corresponding to the data signal line S(j), the switches 333 and 334 are in the on state and the switch 335 is in the off state. In the period t6, the scanning signal G(i) changes from the low level to the high level. This turns the writing control transistor T1 to the on state. In this state, the data potential Vd(i) for image display is applied to the data signal lines S(j) and S(j+1), and the writing based on the data potential Vd(i) is performed in the pixel circuits 200(i, j) and 200(i, j+1). In the period t10 and subsequent periods, in the pixel circuits 200(i, j) and 200(i, j+1), the organic EL element 21 emits light based on the writing in the period t6.

Note that at each time point, one data signal line cannot function as both a write line and a read line. Thus, in each characteristic detection period, the detection of the TFT characteristic for either an odd-numbered column or an even-numbered column is performed. For example, in successive (2×m) vertical scanning periods, first, the detections of the TFT characteristic are sequentially performed for the even-numbered column from the first row to the m-th row, one row at a time, and then the detections of the TFT characteristic are sequentially performed for the odd-numbered column from the first row to the m-th row, one row at a time.

1.4.2 Detection of OLED Characteristic

Figure 10:
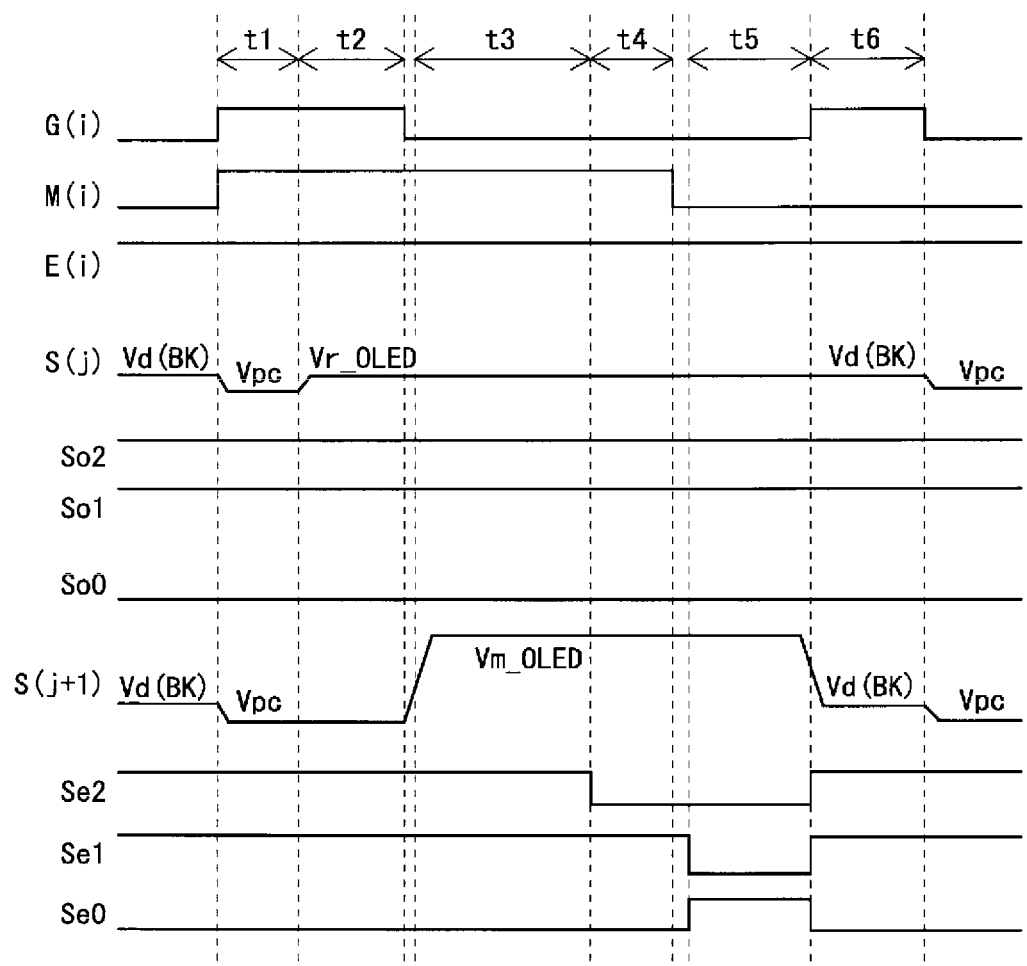
FIG. 10 is a signal waveform diagram when an OLED characteristic is detected in the first embodiment.

FIG. 10 is a signal waveform diagram when the detection of OLED characteristic is performed. Since the detection of the OLED characteristic for the plurality of rows is intensively performed, the rows before and after the monitor row which is focused here (hereinafter referred to as "focused monitor row") are also the monitor rows. With respect to FIG. 10, the periods t1 to t6 are the select periods for the focused monitor row. Immediately before the select period for the focused monitor row, there is a select period for the previous row of the focused monitor row, and immediately after the select period for the focused monitor row, there is a select period for the next row of the focused monitor row. Here, assuming that the i-th row is the focused monitor row, and the pixel circuit 200(i, j) in the i-th row and the j-th column and the data signal lines in the j-th column and the (j+1)-th column will be focused.

Immediately before the start of the period t1, the scanning signal G(i) and the monitor control signal M(i) are at the low level, and the light emission control signal E (i) is at the high level. Accordingly, the writing control transistor T1 and the monitor control transistor T3 are in the off state, and the emission control transistor T4 is in the on state. In addition, immediately before the star of the period t1, the control signals Se2 and Se1 are at the high level, and the control signal Se0 is at the low level. Accordingly, in the output circuit 330 corresponding to the data signal line S(j+1), the switches 333 and 334 are in the on state and the switch 335 is in the off state.

Figure 11:
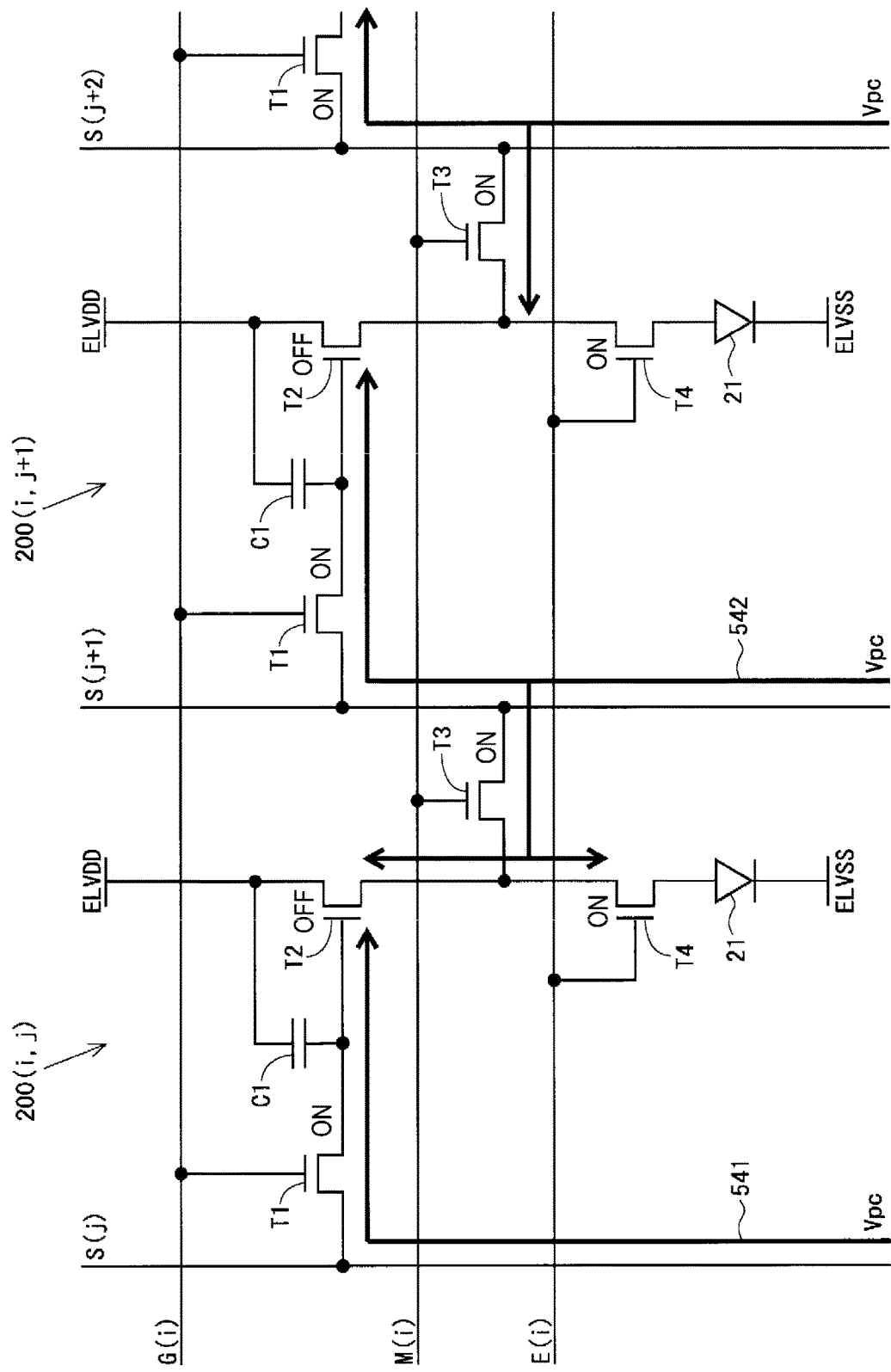
FIG. 11 is a diagram for describing operations when the OLED characteristic is detected in the first embodiment.

In the period t1, the scanning signal G(i) and the monitor control signal M(i) are changed from the low level to the high level. This turns the writing control transistor T1 and the monitor control transistor T3 to the on state. Note that the emission control transistor T4 is maintained in the on state. In the period t1, the initialization potential Vpc that initializes the state of the pixel circuit 200 is applied to the data signal lines S(j) and S(j+1). As a result, as indicated by an arrow denoted by reference numeral 541 in FIG. 11, the state of the capacitor C1 is initialized based on the initialization potential Vpc, and as indicated by an arrow denoted by reference numeral 542 in FIG. 11, the anode potential of the organic EL element 21 is initialized based on the initialization potential Vpc.

Figure 12:
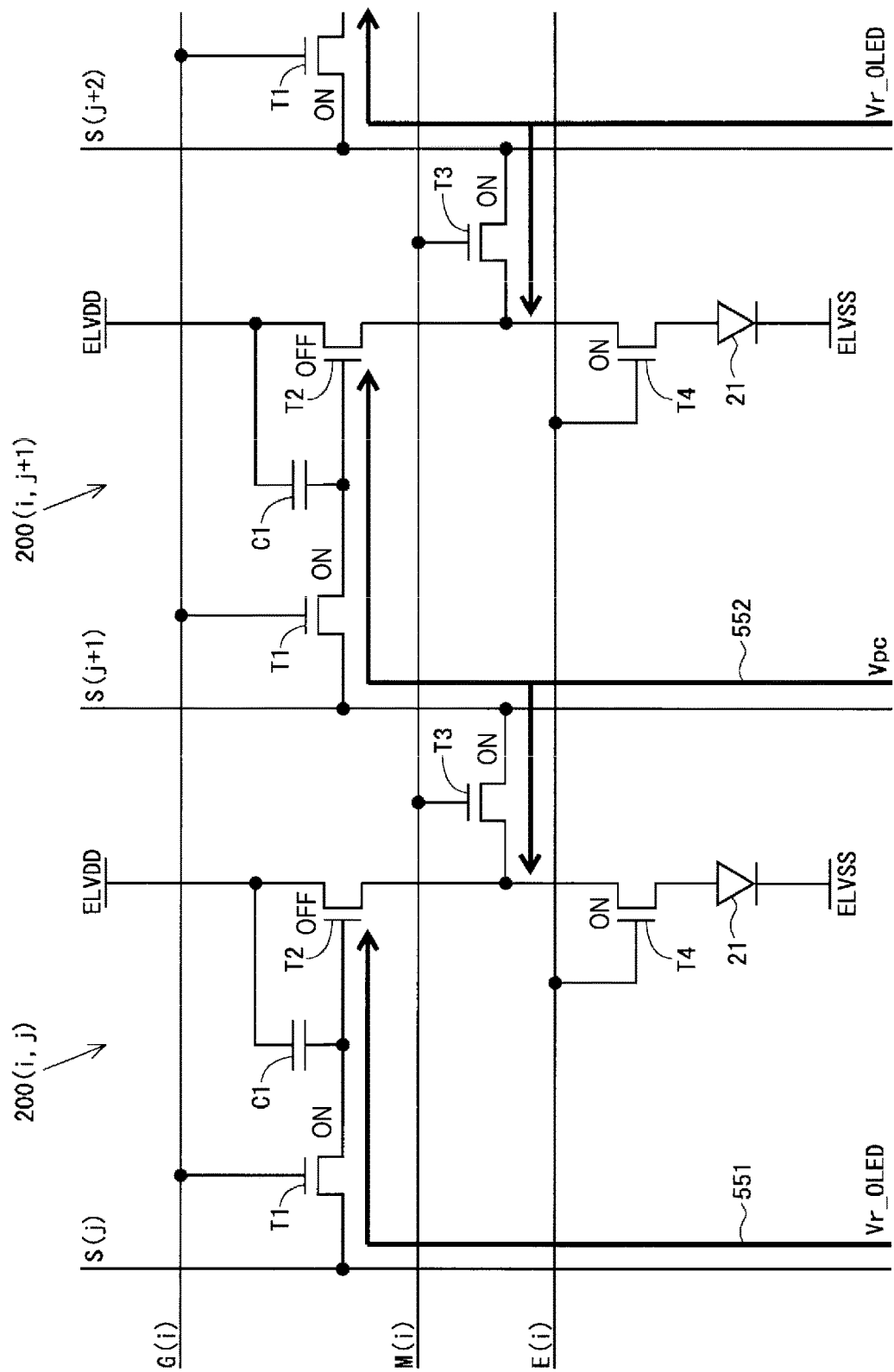
FIG. 12 is a diagram for describing operations when the OLED characteristic is detected in the first embodiment.

In the period t2, a characteristic detection potential Vr_OLED is applied to the data signal line S(j). As a result, as indicated by an arrow denoted by reference numeral 551 in FIG. 12, writing based on the characteristic detection potential Vr_OLED is performed. Note that the characteristic detection potential Vr_OLED is a potential such that the drive transistor T2 is turned to the off state. In the period t2, the initialization potential Vpc is applied to the data signal line S(j+1) (see an arrow denoted by reference numeral 552 in FIG. 12) in the same manner as in the period t1. Note that the length of the period t2 is set such that the capacitor C1 is sufficiently charged based on the characteristic detection potential Vr_OLED.

Figure 13:
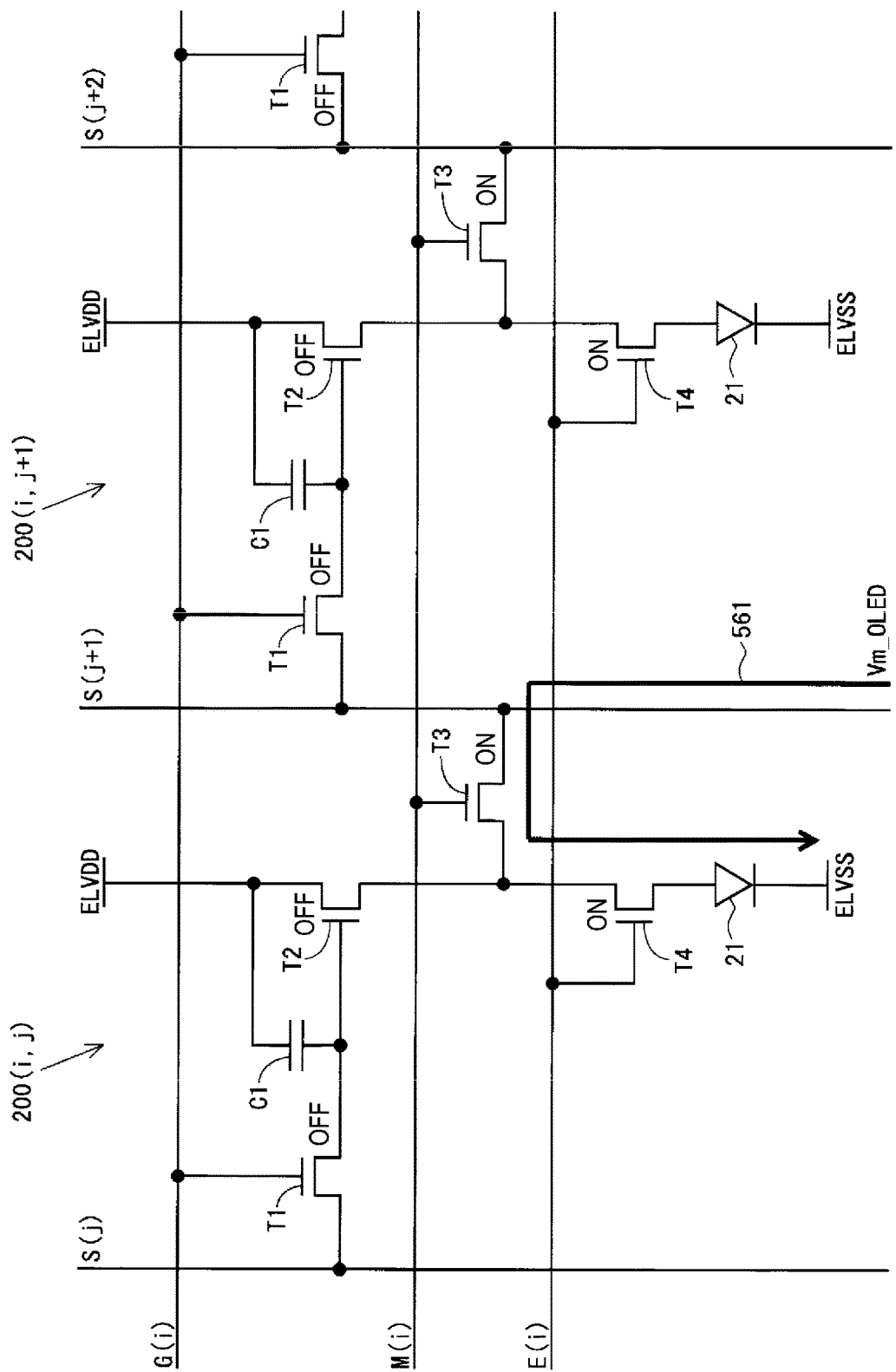
FIG. 13 is a diagram for describing operations when the OLED characteristic is detected in the first embodiment.

In the period t3, the scanning signal G(i) is changed from the high level to the low level. This turns the writing control transistor T1 to the off state, and the charging voltage of the capacitor C1 is determined. At this time, the drive transistor T2 is in the off state. The monitor control transistor T3 and the emission control transistor T4 are maintained in the on state. In this state, the current measurement potential Vm_OLED is applied to the data signal line S(j+1). As a result, as indicated by an arrow denoted by reference numeral 561 in FIG. 13, a current (measurement current) corresponding to the characteristic of the organic EL element 21 flows from the data signal line S(j+1) to the organic EL element 21 via the monitor control transistor T3. At this time, the organic EL element 21 emits light. Note that the current measurement potential Vm_OLED is a potential such that the drive transistor T2 is turned to the off state and the organic EL element 21 is turned to the emitting state. The period t3 is set to a length sufficient for the measurement current flowing through the data signal S(j+1) to stabilize.

In the period t4, the control signal Se2 changes from the high level to the low level. As a result, similar to when the TFT characteristic is detected (similar to the period t4 in FIG. 5), in the output circuit 330 corresponding to the data signal line S(j+1), the output voltage of the operational amplifier 331 (charging voltage of the capacitor 332) is turned to a voltage corresponding to the current flowing through the data signal line S(j+1).

Figure 14:
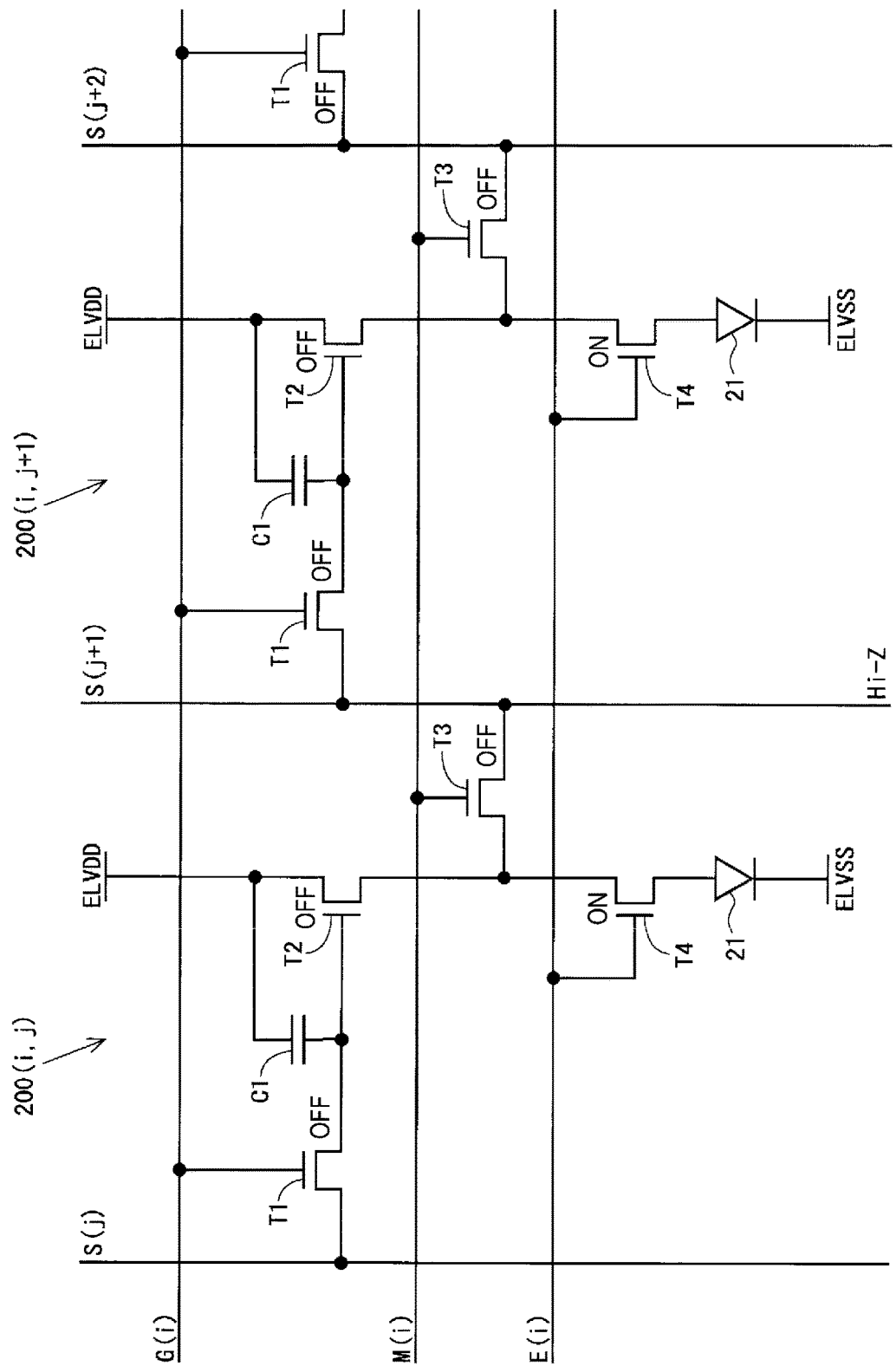
FIG. 14 is a diagram for describing operations when the OLED characteristic is detected in the first embodiment.

In the period t5, the control signal Se1 is changed from the high level to the low level, and the control signal Se0 is changed from the low level to the high level. As a result, similar to when the TFT characteristic is detected (similar to the period t5 in FIG. 5), the state of the data signal line S(j+1) becomes one of high impedance (see FIG. 14), and the potential of the internal data line Sin(j+1) immediately before the start of the period t5 is maintained. In this state, the output voltage as the monitor data MO of the operational amplifier 331 (charging voltage of the capacitor 332) is converted to a digital signal by the A/D converter 324. The converted monitor data MO is transmitted to the display control circuit 10 via the drive signal generation circuit 31, and is used for the compensation calculation processing in the compensation processing unit 12. Note that in the period t5, by the monitor control signal M(i) changing from the high level to the low level, the monitor control transistor T3 is turned to the off state.

In the period t6, the control signals Se2 and Se1 are changed from the low level to the high level, and the control signal Se0 is changed from the high level to the low level.

This turns the switches 333 and 334 to the on state and turns the switch 335 to the off state, in the output circuit 330 corresponding to the data signal line S(j+1). At this time, also in the output circuit 330 corresponding to the data signal line S(j), the switches 333 and 334 are in the on state and the switch 335 is in the off state. In the period t6, the scanning signal G(i) changes from the low level to the high level. This turns the writing control transistor T1 to the on state. In this state, the data potential Vd(BK) for black color display is applied to the data signal lines S(j) and S(j+1), and the writing based on the data potential Vd(BK) is performed in the pixel circuits 200(i, j) and 200(i, j+1). As a result, in the pixel circuits 200(i, j) and 200(i, j+1), the organic EL element 21 is turned off.

1.4.3 Summary of Driving Method

Both the processings of detecting the TFT characteristic and the processings of detecting an OLED characteristic include a step of applying an initialization potential for initializing the state of the pixel circuit 200 to the data signal line (initialization potential application step), a step of applying a potential for characteristic detection to the data signal line (characteristic detection potential application step), a step of applying a current measurement potential to the data signal line (current measurement potential application step), a step of charging the capacitor 332 in the output circuit 330 based on the current flowing through the data signal line (charging step for measuring current), and a step of performing A/D conversion based on the charging voltage of the capacitor 332 (A/D conversion step). When the TFT characteristic is detected, as illustrated in FIG. 5, in the period t2, the application of the characteristic detection potential Vr_TFT to the data signal line S(j) is started, and the application of the current measurement potential Vm_TFT to the data signal line S(j+1) is started. In other words, the characteristic detection potential application step and the current measurement potential application step are started at the same timing.

Note that with respect to the potential applied to the data signal line, for example, the initialization potential Vpc, the current measurement potential Vm_TFT, the characteristic detection potential Vr_OLED, and the data potential Vd(BK) for black color display may be set to the same potential.

Furthermore, in the present embodiment, with respect to the detection of the OLED characteristic, the characteristic detection for either the odd-numbered column or the even-numbered column is performed in one unit monitor processing. In other words, with respect to the processings of detecting the OLED characteristic for an arbitrary row, for example, in a case where the detection of the OLED characteristic for the odd-numbered column is performed in the K-th processing, where K is an integer of 1 or more, the detection of the OLED characteristic for the even-numbered column is performed in the (K+1)-th processing. More specifically, the processings of detecting the characteristic of the organic EL element 21 included in the pixel circuit 200 in the i-th row are generalized as follows, where K is an integer of 1 or more. In the K-th processing, the characteristic detection potential is applied to the data signal lines in the odd-numbered column in the characteristic detection potential application step, and the current measurement potential is applied to the data signal lines in the even-numbered column in the current measurement potential application step. In the (K+1)-th processing, the characteristic detection potential is applied to the data signal lines in the even-numbered column in the characteristic detection potential application step, and the current measurement potential is applied to the data signal lines in the odd-numbered column in the current measurement potential application step.

1.5 Effect

Figure 24:
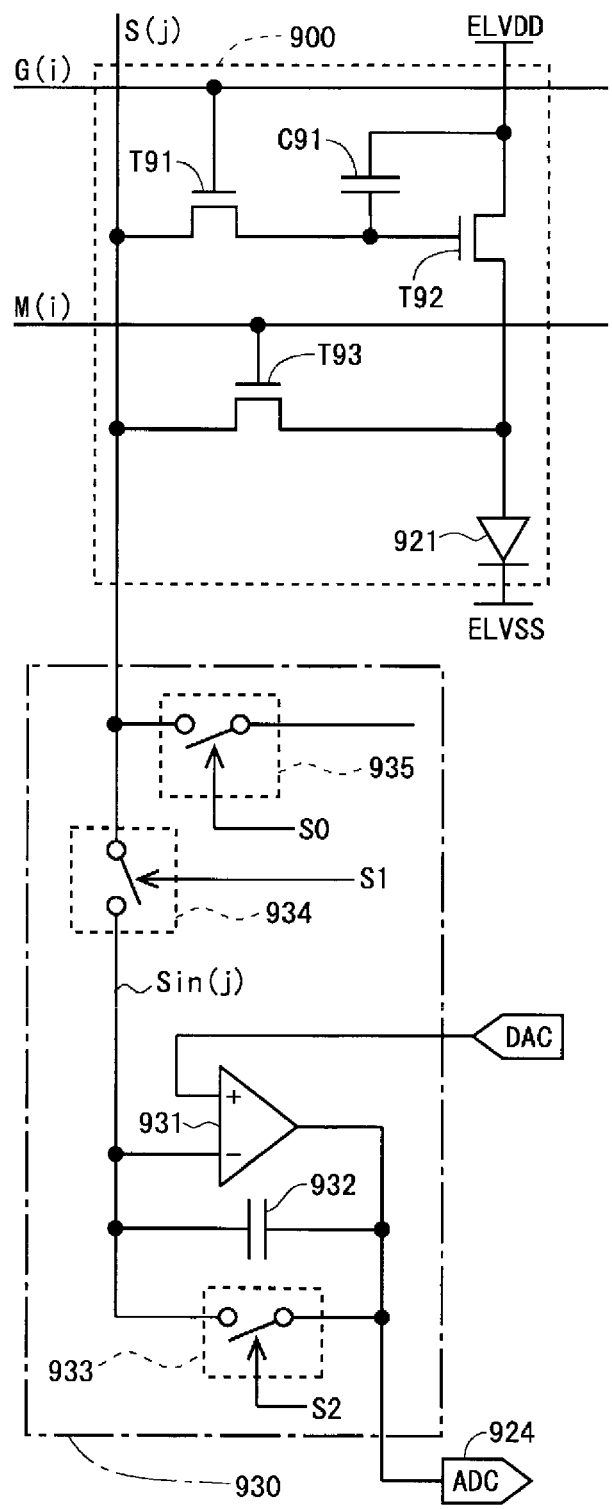
FIG. 24 is a circuit diagram in a case where the data signal line and the monitor line are shared in an example in the related art, illustrating a configuration of the pixel circuit in the i-th row and the j-th column and the output circuit corresponding to the j-th column.
Figure 25:
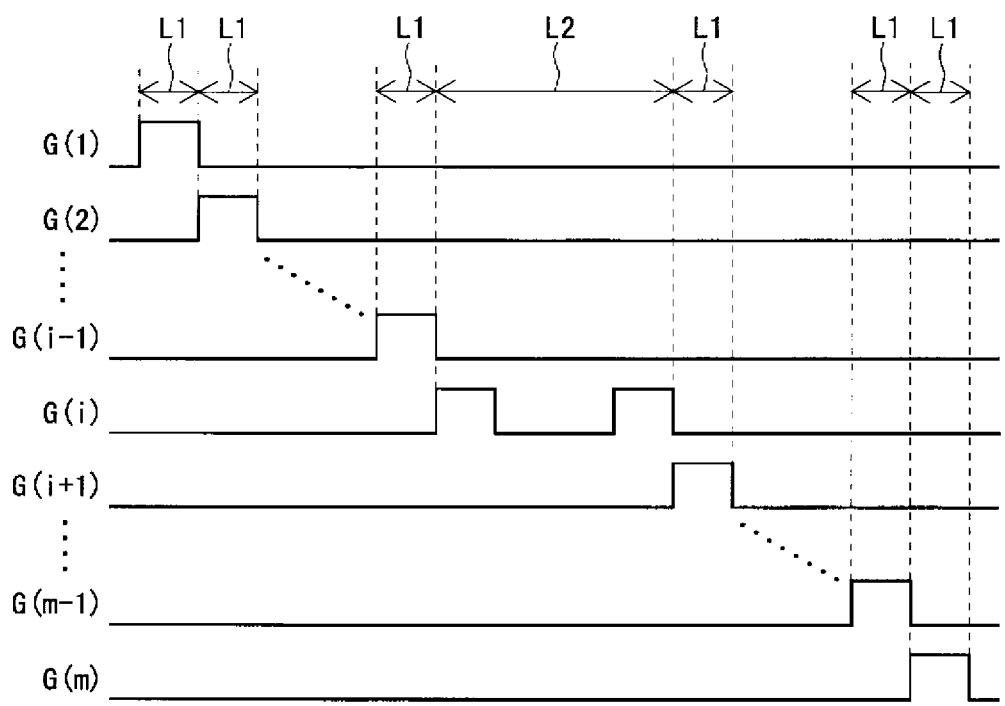
FIG. 25 is a diagram for describing the drive of the scanning signal line in the example in the related art.
Figure 26:
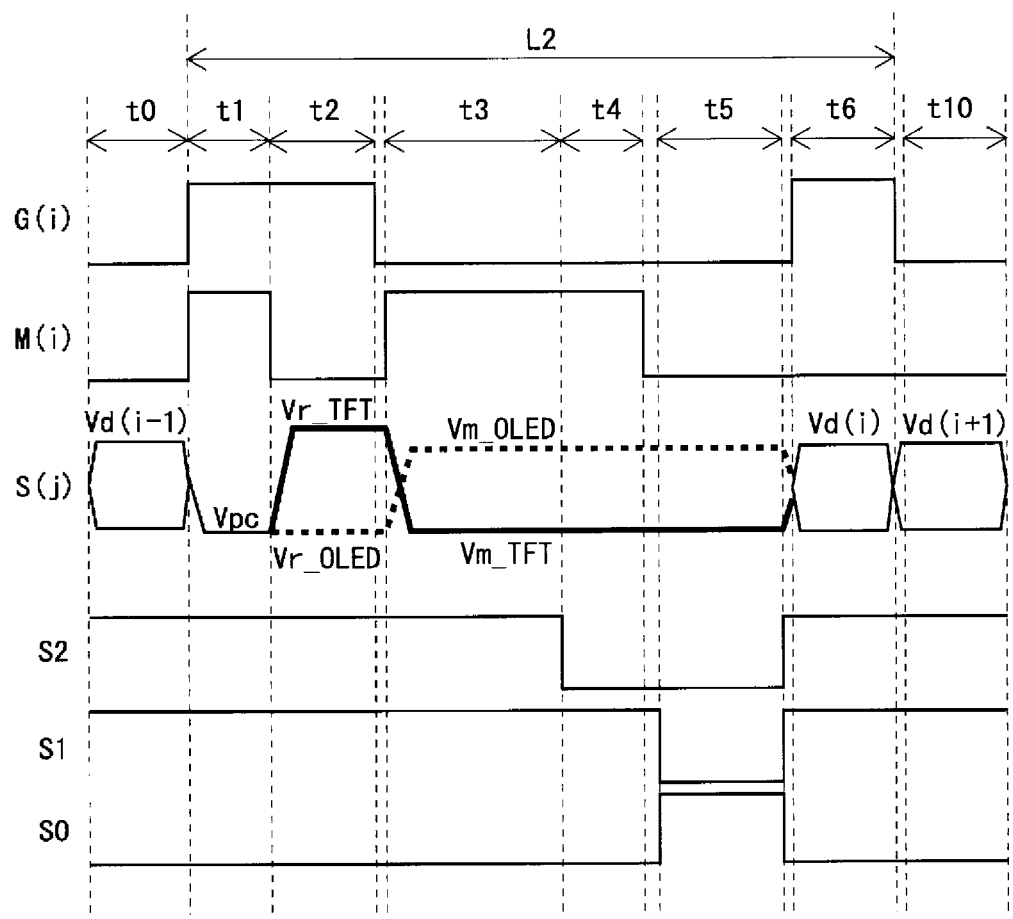
FIG. 26 is a signal waveform diagram in the example in the related art.

According to the configuration in the related art illustrated in FIG. 24, in the characteristic detection monitor, after the end of the application of the characteristic detection potential to a data signal line, the current measurement potential must be applied to the data signal line (see FIG. 26). As a result, the monitor time is increased. In contrast, according to the present embodiment, with respect to the characteristic detection of the circuit elements (the drive transistor T2 and the organic EL element 21) in each of the pixel circuits 200, the data signal line functioning as the write line and the data signal line functioning as the read line are different from each other. Thus, when the TFT characteristic is detected, the application of the current measurement potential Vm_TFT to the read line can be started at the same timing as the application of the characteristic detection potential Vr_TFT to the write line, as illustrated in FIG. 5. As a result, the monitor time is shortened compared to the configuration in the related art.

Figure 15:
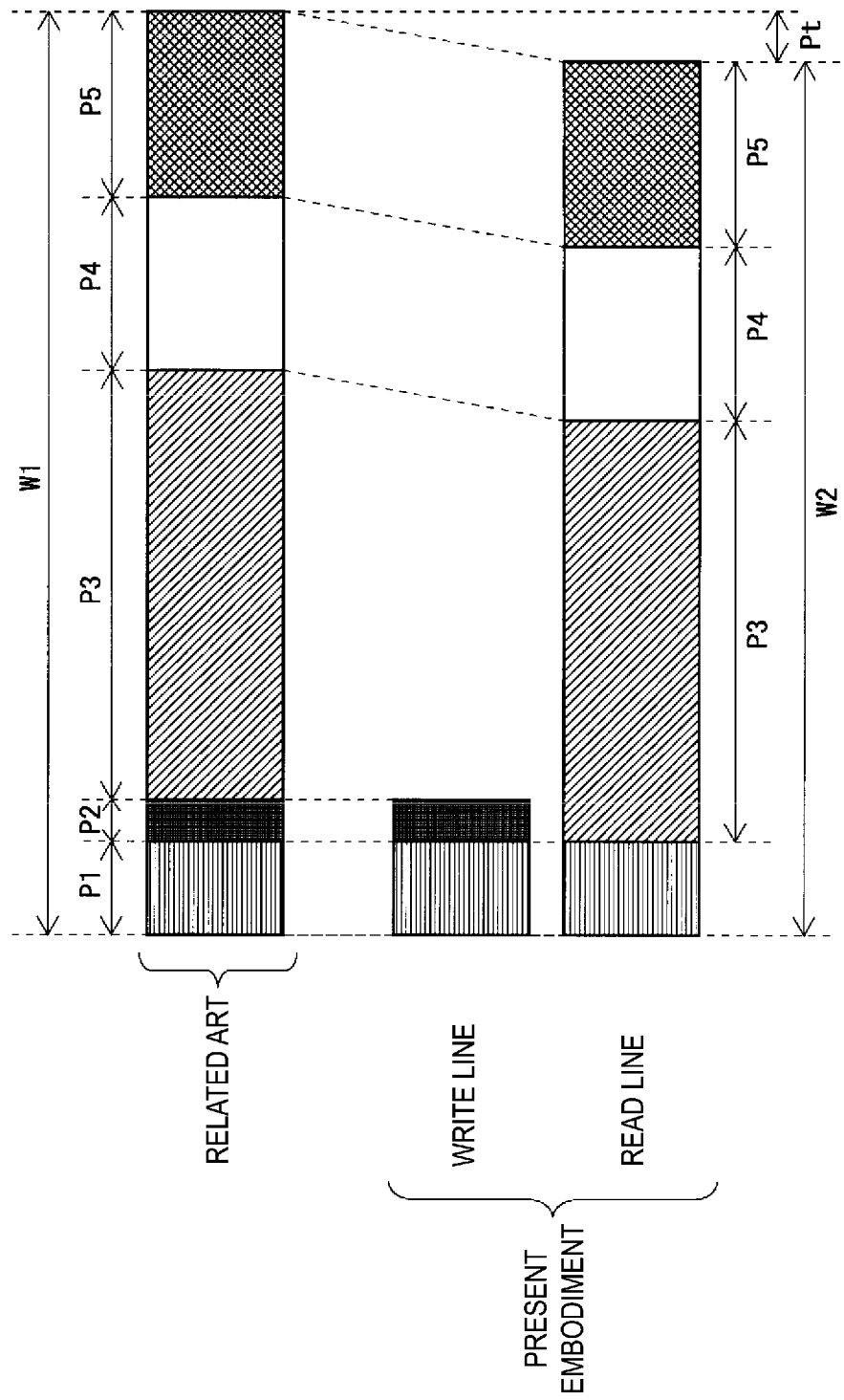
FIG. 15 is a diagram for describing an effect of the first embodiment.

FIG. 15 is a diagram for describing an effect of the present embodiment. Hereinafter, a period required for the application of the initialization potential Vpc to the data signal line is referred to as "initialization period," and a period required for the application of the characteristic detection potential Vr_TFT to the data signal line functioning as the write line is referred to as "write period", a period required for the application of the current measurement potential Vm_TFT to the data signal line functioning as the read line (period required for the potential of the data signal line to stabilize) is referred to as "stabilization period", a period required for the charging of the capacitor in the output circuit (output circuit also serving as the current monitor circuit) is referred to as "monitor charging period", and a period required for the A/D conversion is referred to as "A/D conversion period". Note that with respect to the A/D conversion period, the timing of the processing of the actual A/D conversion may be after the end of the unit monitor processing, and a processing such as holding the data for A/D conversion may be performed until correction processing of the data signal to be corrected is performed. The initialization period is denoted by reference numeral P1, the write period is denoted by reference numeral P2, the stabilization period is denoted by reference numeral P3, the monitor charging period is denoted by reference numeral P4, and the A/D conversion period is denoted by reference numeral P5. According to the configuration in the related art, a monitor time W1 for the detection of the TFT characteristic is the sum of the lengths of the initialization period P1, the write period P2, the stabilization period P3, the monitor charging period P4, and the A/D conversion period P5. In contrast, according to the present embodiment, as described above, the application of the current measurement potential Vm_TFT to the read line can be started at the same timing as the application of the characteristic detection potential Vr_TFT to the write line. In other words, as illustrated in FIG. 15, the write period P2 and the stabilization period P3 can be overlapped. Thus, a monitor time W2 for the detection of the TFT characteristic in the present embodiment is shorter than the monitor time W1 according to the configuration in the related art by a time Pt. The time Pt shortened in this manner corresponds to the length of the write period P2.

As described above, according to the present embodiment, the monitor time is shortened compared to the configuration in the related art. Each of the data signal lines except for the data signal lines on both ends of the display portion 20 is used as both the write line and the read line. Thus, unlike the configuration disclosed in WO 2014/141958 pamphlet, the number of wiring lines in the display portion 20 does not increase. As described above, with respect to the organic EL display device having the external compensation function, the monitor time can be shortened without increasing the number of wiring lines.

1.6 Modified Example

A modified example of the first embodiment will be described below.

1.6.1 First Modified Example

In the first embodiment described above, although when the TFT characteristic is detected, the application of the current measurement potential to the read line is started at the same timing as the application of the characteristic detection potential to the write line, when the OLED characteristic is detected, the application of the current measurement potential to the read line is started after a sufficient amount of time has elapsed from the application of the characteristic detection potential to the write line. However, the disclosure is not limited thereto, even when the OLED characteristic is detected, the application of the current measurement potential to the read line can be started at the same timing as the application of the characteristic detection potential to the write line.

Figure 16:
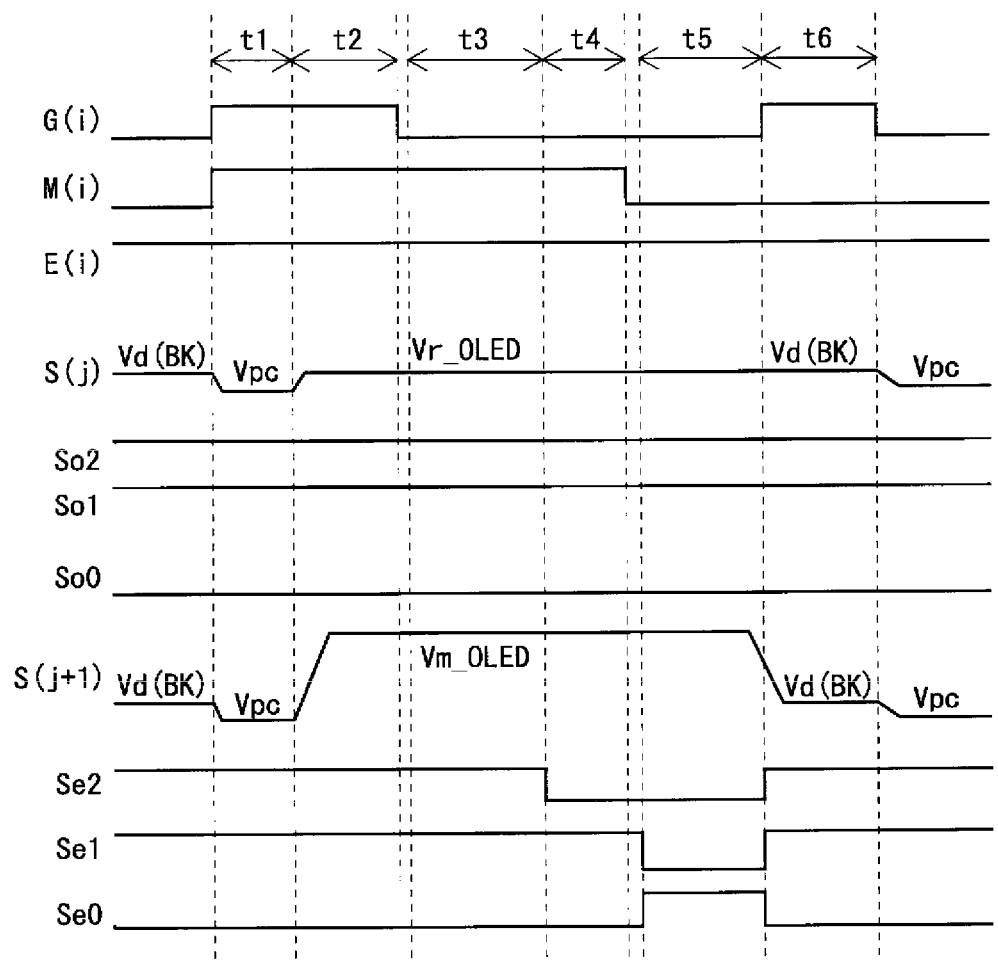
FIG. 16 is a signal waveform diagram when the OLED characteristic is detected in a first modified example of the first embodiment.
Figure 17:
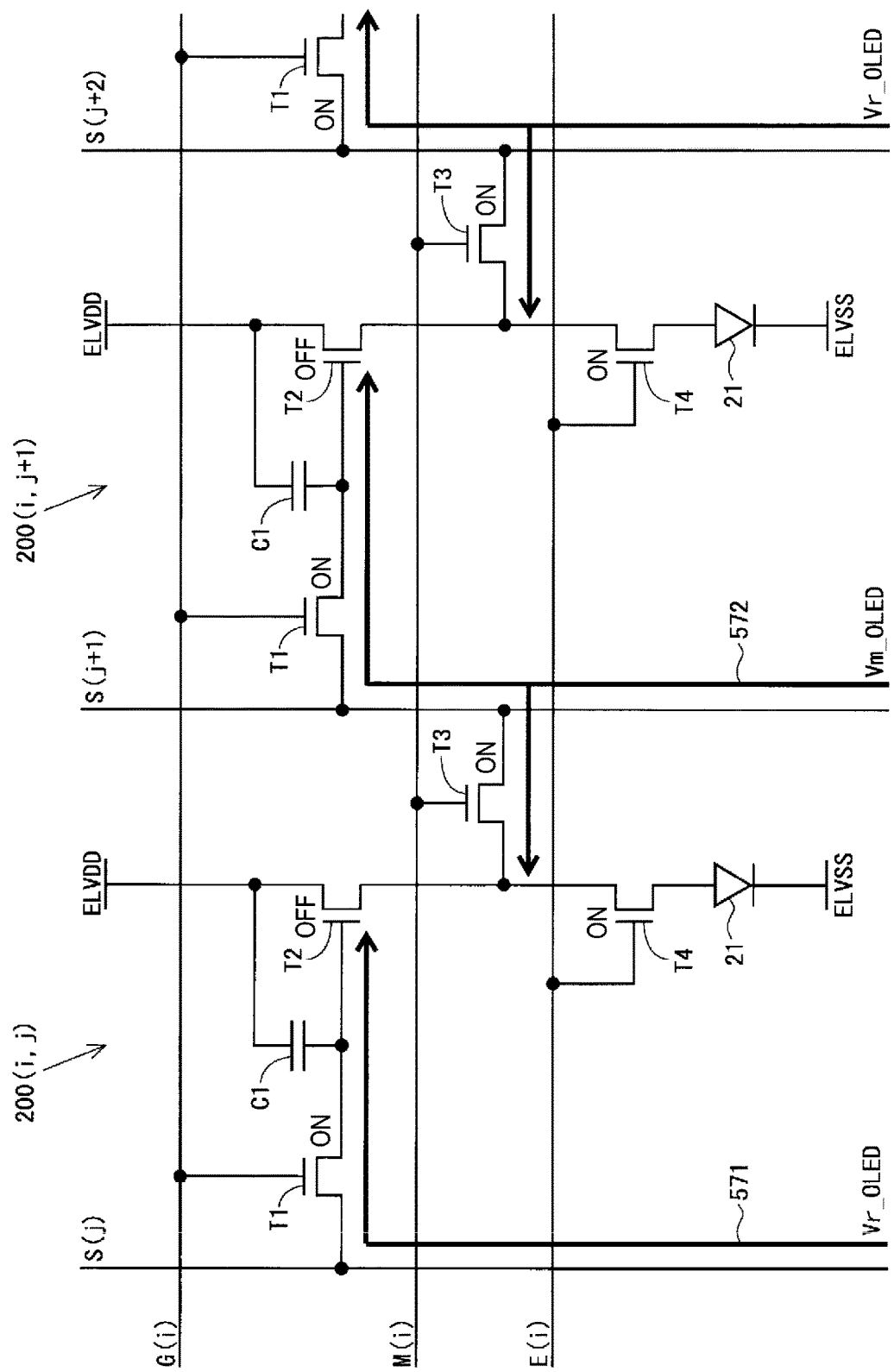
FIG. 17 is a signal waveform diagram when the OLED characteristic is detected in the first modified example of the first embodiment.

FIG. 16 is a signal waveform diagram when the detection of the OLED characteristic is performed in the present modified example. The period t1 and previous periods are similar to those in the first embodiment. In the period t2, a characteristic detection potential Vr_OLED is applied to the data signal line S(j). As a result, as indicated by an arrow denoted by reference numeral 571 in FIG. 17, writing based on the characteristic detection potential Vr_OLED is performed. In the period t2, the current measurement potential Vm_OLED is applied to the data signal line S(j+1). As a result, the anode potential of the organic EL element 21 and the potential of the data signal line S(j+1) change toward the current measurement potential Vm_OLED (see the arrow denoted by reference numeral 572 in FIG. 7).

In the period t3, the scanning signal G(i) is changed from the high level to the low level. This turns the writing control transistor T1 to the off state, and the charging voltage of the capacitor C1 is determined. At this time, the drive transistor T2 is in the off state. The monitor control transistor T3 and the emission control transistor T4 are maintained in the on state. As a result, as indicated by an arrow denoted by reference numeral 561 in FIG. 13, a current (measurement current) corresponding to the characteristic of the organic EL element 21 flows from the data signal line S(j+1) to the organic EL element 21 via the monitor control transistor T3. The period t4 and subsequent periods are similar to those in the first embodiment.

As described above, according to the present modified example, not only when the TFT characteristic is detected but also when the OLED characteristic is detected, the application of the current measurement potential to the read line (current measurement potential application step) can be started at the same timing as the application of the characteristic detection potential to the write line (characteristic detection potential application step). As a result, the monitor time is shortened also for the detection of OLED characteristic compared to a related art.

1.6.2 Second Modified Example

In the first embodiment described above, with respect to the detection of the OLED characteristic, the characteristic detection for either the odd-numbered column or the even-numbered column is performed in each characteristic detection period. However, the disclosure is not limited thereto, and the detection of the OLED characteristic for all of the columns can also be performed in each characteristic detection period.

Figure 18:
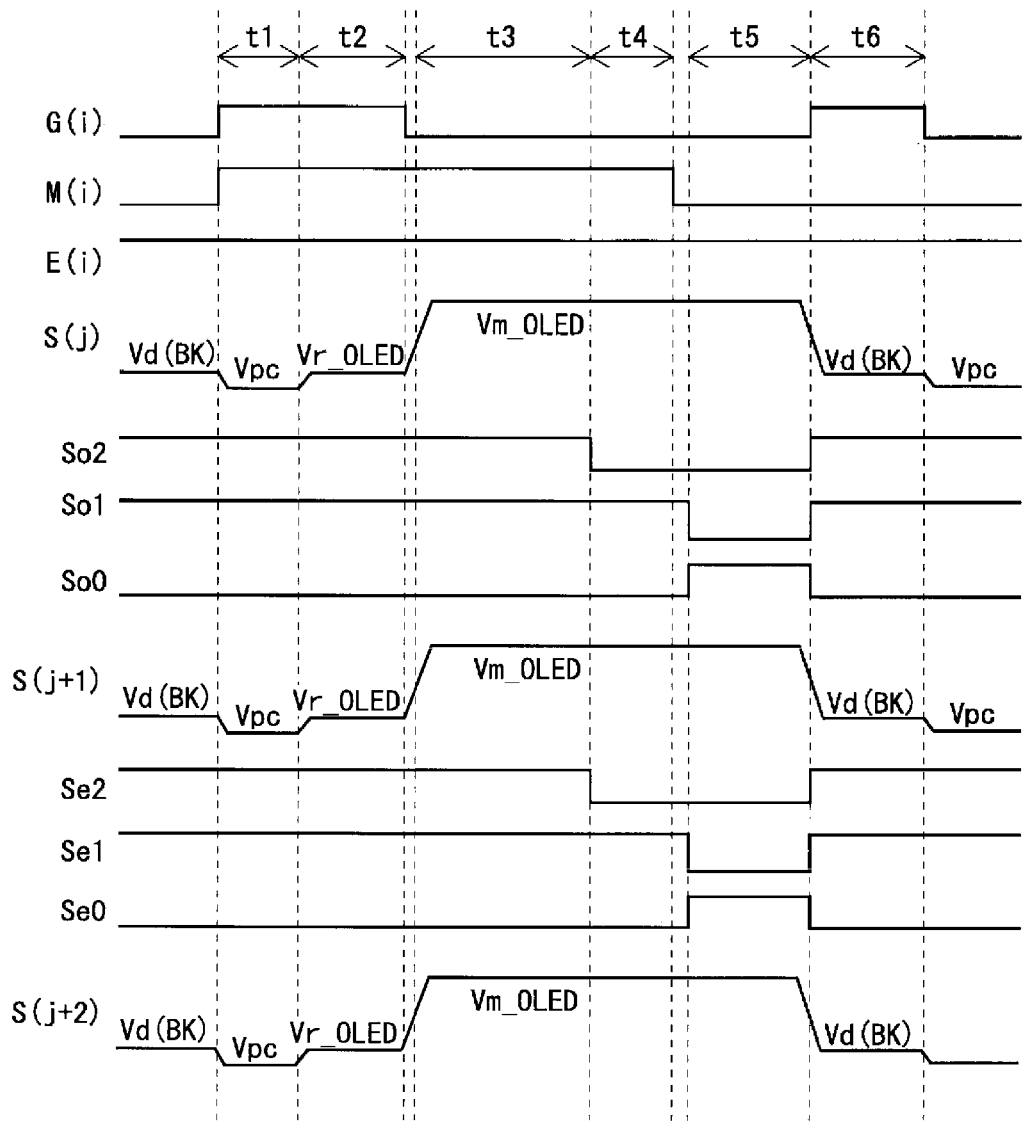
FIG. 18 is a signal waveform diagram when the OLED characteristic is detected in a second modified example of the first embodiment.

FIG. 18 is a signal waveform diagram when the detection of the OLED characteristic is performed in the present modified example. As can be seen from FIG. 18, the waveform of each signal for the j-th column and the (j+1)-th column change in the same manner. In other words, the waveform of each signal changes in the same manner in all columns. Operations related to the characteristic detection in the j-th column will be described below.

The period t1 and previous periods are similar to those in the first embodiment. In the period t2, a characteristic detection potential Vr_OLED is applied to the data signal line S(j). As a result, writing based on the characteristic detection potential Vr_OLED is performed. In the period t2, the characteristic detection potential Vr_OLED is applied also to the data signal line S(j+1). As a result, the anode potential of the organic EL element 21 changes toward the characteristic detection potential Vr_OLED.

In the period t3, the scanning signal G(i) is changed from the high level to the low level. This turns the writing control transistor T1 to the off state, and the charging voltage of the capacitor C1 is determined. At this time, the drive transistor T2 is in the off state. The monitor control transistor T3 and the emission control transistor T4 are maintained in the on state. In this state, the current measurement potential Vm_OLED is applied to the data signal line S(j+1). As a result, a current (measurement current) corresponding to the characteristic of the organic EL element 21 flows from the data signal line S(j+1) to the organic EL element 21 via the monitor control transistor T3. At this time, the organic EL element 21 emits light.

In the period t4 and the period t5, a current flowing through the data signal line S(j+1) is measured by the output circuit 330 in the same manner as in the first embodiment. The period t6 and subsequent periods are also similar to those in the first embodiment.

As described above, the waveform of each signal for the j-th column and the (j+1)-th column change in the same manner. Thus, the characteristic detection in the (j+1)-th column is performed in the same manner as the characteristic detection in the j-th column described above. More specifically, the characteristic detection of all the columns is performed in the same manner in one characteristic detection period.

Note that the operations when the characteristic of the organic EL element 21 included in the pixel circuit 200 in the i-th row is detected are generalized as follows, where z is an integer of (n−1) or more. By the monitor driver 42 turning on the monitor control transistor T3 included in the pixel circuit 200 in the i-th row, the anode terminal of the organic EL element 21 included in the pixel circuit 200(i, Z) in the i-th row and the z-th column is connected to the output circuit 330 corresponding to the data signal line S(z+1) of the (z+1)-th column, and the anode terminal of the organic EL element 21 included in the pixel circuit 200(i, z+1) in the i-th row and the (z+1)-th column is connected to the output circuit 330 corresponding to the data signal line S(z+2) of the (z+2)-th column. The source driver 30 applies a current measurement potential as a data signal for measuring a current representative of the characteristic of the organic EL element 21 to both of the data signal line S(z+1) of the (z+1)-th column and the data signal line S(z+2) of the (z+2)-th column.

According to the present modified example, with respect to the detection of OLED characteristic, the overall monitor time is shortened compared to the case where the characteristic detection for either the odd-numbered column or the even-numbered column is performed in each characteristic detection period.

2. Second Embodiment

2.1 Overview

In the first embodiment, the unit monitor processing is performed only once for one characteristic detection period. In contrast, in the present embodiment, in order to increase the detection accuracy of the characteristic, the unit monitor processing is repeatedly performed three times during one characteristic detection period. When the TFT characteristic is detected, by sequentially applying three characteristic detection potentials different from each other to the write line during one characteristic detection period, three monitor data MO for each pixel circuit 200 to be processed are obtained. When the OLED characteristic is detected, by sequentially applying three current measurement potentials different from each other to the read line during one characteristic detection period, three monitor data MO for each pixel circuit 200 to be processed are obtained. Note that the number of unit monitor processings repeated during one characteristic detection period is not particularly limited.

The overall configuration of the organic EL display device 1, the configuration of the pixel circuit 200, and the configuration of the output circuit 330 are similar to those in the first embodiment, and thus the description thereof will be omitted (see FIG. 1 to FIG. 4).

2.2 Driving Method

Similarly to the first embodiment, in the present embodiment as well, the detection of the TFT characteristic for one row is performed in each vertical scanning period, and the detection of the OLED characteristic for a plurality of rows is intensively performed when the power is turned on or off. Operations when the detection of the TFT characteristic is performed and operations when the detection of the OLED characteristic is performed will be sequentially described below.

2.2.1 Detection of TFT Characteristic

Figure 19:
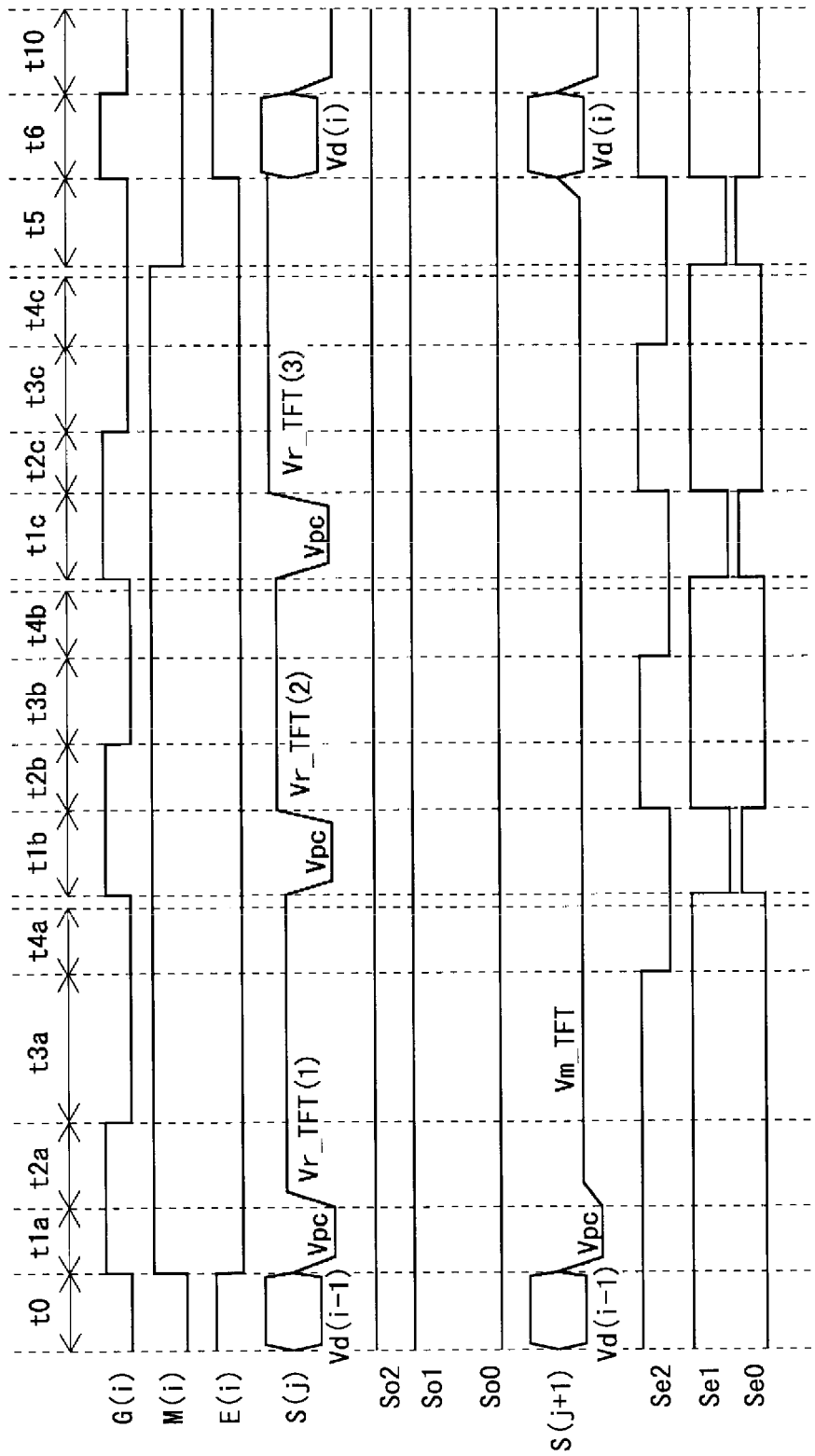
FIG. 19 is a signal waveform diagram when the TFT characteristic is detected in a second embodiment.

FIG. 19 is a signal waveform diagram when the TFT characteristic is detected. With respect to FIG. 19, the periods t1a to t6 are select periods for the monitor row (i-th row), the period t0 is a select period for the normal row that is a previous row of the monitor row, and the period t10 is a select period for the normal row that is the next row of the monitor row.

The period t0 is similar to that in the first embodiment. The periods t1a to t4a are similar to the periods t1 to t4 (see FIG. 5) in the first embodiment. However, a reference sign Vr_TFT(1) is denoted to the characteristic detection potential applied to the data signal line S(j) in the period t2a. The application of the current measurement potential Vm_TFT to the data signal line S(j+1) is started in the period t2a. At the end of period t4a, the output voltage of the operational amplifier 331 in the output circuit 330 corresponding to the data signal line S(j+1) is the voltage corresponding to the current flowing through the data signal line S(j+1).

Figure 20:
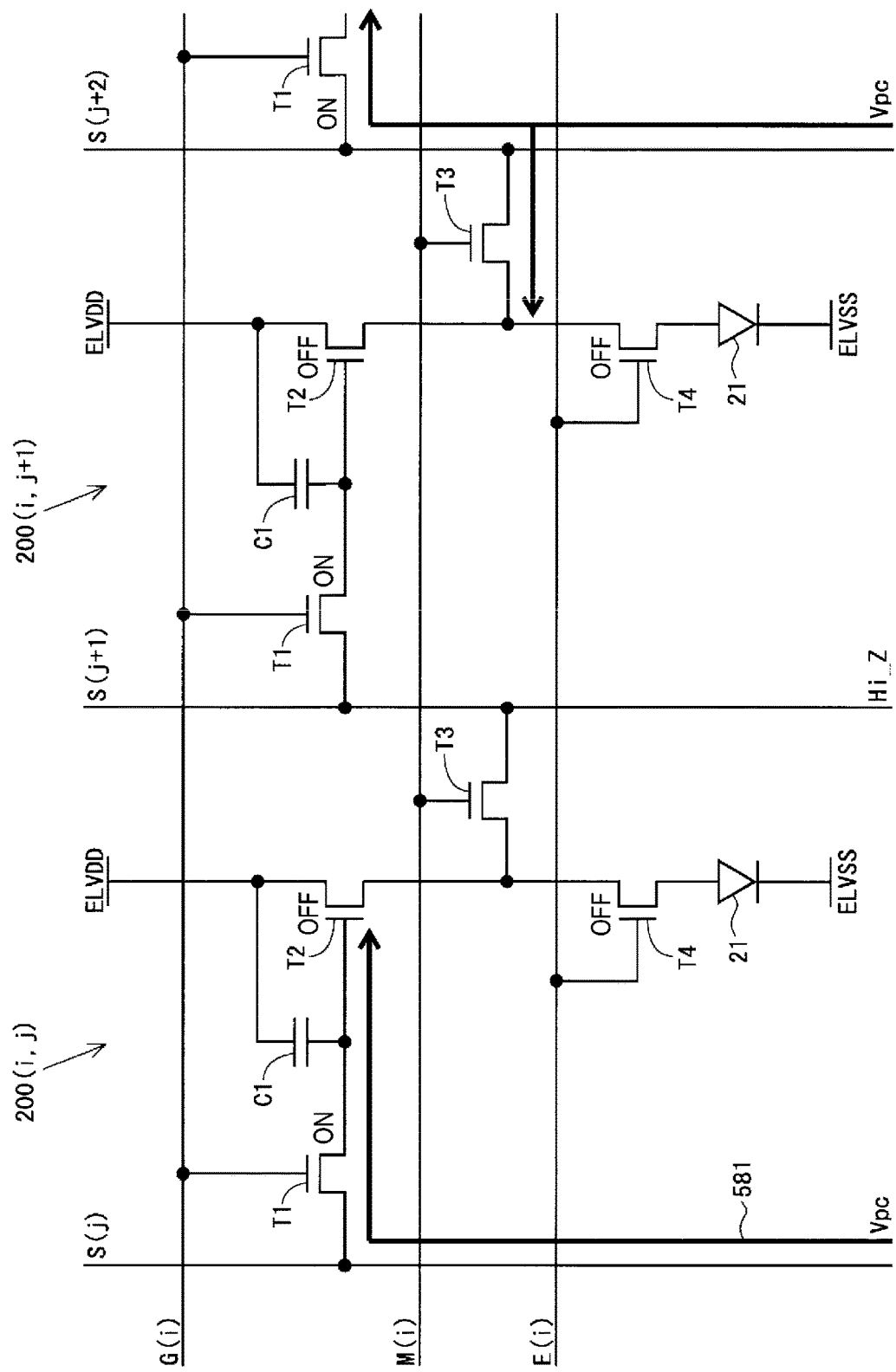
FIG. 20 is a diagram for describing operations when the TFT characteristic is detected in the second embodiment.

In the period t1b, the control signal Se1 is changed from the high level to the low level, and the control signal Se0 is changed from the low level to the high level. As a result, in the output circuit 330 corresponding to the data signal line S(j+1), the switch 334 changes from the on state to the off state and the switch 335 changes from the off state to the on state. As a result, as illustrated in FIG. 20, the state of the data signal line S(j+1) becomes one of high impedance. By the switch 334 being in the off state, the potential of the internal data line Sin(j+1) immediately before the start of the period t1b is maintained. In this state, the output voltage as the monitor data MO of the operational amplifier 331 (charging voltage of the capacitor 332) is converted to a digital signal by the A/D converter 324. The converted monitor data MO is used for the compensation calculation processing in the compensation processing unit 12 in the display control circuit 10. In the period t1b, the scanning signal G(i) changes from the low level to the high level again. This turns the writing control transistor T1 to the on state. At this time, the initialization potential Vpc is applied to the data signal line S(j). As a result, as indicated by an arrow denoted by reference numeral 581 in FIG. 20, the state of the capacitor C1 is initialized based on the initialization potential Vpc. In this manner, in the period t1b, during the period in which the A/D conversion of the monitor data MO for the first unit monitor processing is performed, the initialization for the second unit monitor processing is performed on the pixel circuit 200 to be processed.

In the period t2b, the control signals Se2 and Se1 are changed from the low level to the high level, and the control signal Se0 is changed from the high level to the low level. This turns the switches 333 and 334 to the on state and turns the switch 335 to the off state, in the output circuit 330 corresponding to the data signal line S(j+1). As a result, the data signal line S(j+1) and the internal data line Sin(j+1) enter a state of being electrically connected to each other, and the current measurement potential Vm_TFT is applied to the data signal line S(j+1). At this time, also in the output circuit 330 corresponding to the data signal line S(j), the switches 333 and 334 are in the on state and the switch 335 is in the off state. Accordingly, the data signal line S(j) and the internal data line Sin(j) are electrically connected to each other. The writing control transistor T1 is maintained in the on state. In the state described above, a characteristic detection potential Vr_TFT(2) is applied to the data signal line S(j). As a result, writing based on the characteristic detection potential Vr_TFT(2) is performed. Note that the characteristic detection potential Vr_TFT(2) is a potential different from the characteristic detection potential Vr_TFT(1).

The periods t3b to t4b are similar to the periods t3 to t4 in the first embodiment (also similar to the periods t3a to t4a in the present embodiment). The periods t1c to t4c are similar to the periods t1b to t4b. However, in the period t2c, a characteristic detection potential Vr_TFT(3) is applied to the data signal line S(j). The characteristic detection potential Vr_TFT(3) is a potential different from the characteristic detection potential Vr_TFT(1) and the characteristic detection potential Vr_TFT(2).

In the period t5, similar to the period t1b, the output voltage as the monitor data MO of the operational amplifier 331 (charging voltage of the capacitor 332) is converted to a digital signal by the A/D converter 324. In the period t5, the monitor control signal M(i) is changed from the high level to the low level. This turns the monitor control transistor T3 to the off state. The period t6 and subsequent periods are similar to those in the first embodiment.

Figure 21:
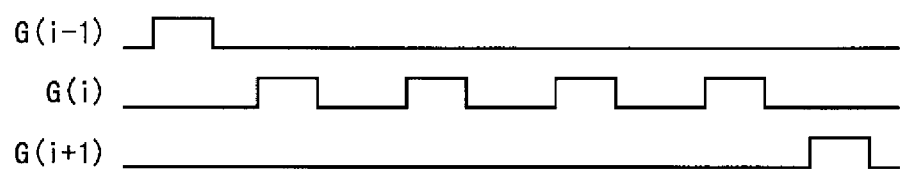
FIG. 21 is a diagram for describing the drive of the scanning signal line when the TFT characteristic is detected in the second embodiment.

As described above, in the present embodiment, with respect to the processings of detecting the characteristic of the drive transistor T2 included in the pixel circuit 200(i, j) in the i-th row and the j-th column, during the select period for the monitor row (the i-th row), the plurality of characteristic detection potentials Vr_TFT(1) to Vr_TFT(3) different from each other is sequentially applied to the data signal lines. To achieve the writing based on the plurality of characteristic detection potentials Vr_TFT(1) to Vr_TFT(3), in the period from when the scanning signal line G(i−1) in the (i−1)-th row changes from the on state to the off state to when the scanning signal line G(i+1) in the (i+1)-th row changes from the off state to the on state, the scanning signal line G(i) in the i-th row is turned on a plurality of times (see FIG. 21). An initialization potential Vpc that initializes the state of the pixel circuit 200 is applied to the data signal line S(j) between the k-th application of the characteristic detection potential to the data signal line S(j) and the (k+1)-th application of the characteristic detection potential to the data signal line S(j), where K is an integer of 1 or more.

2.2.2 Detection of OLED Characteristic

Figure 22:
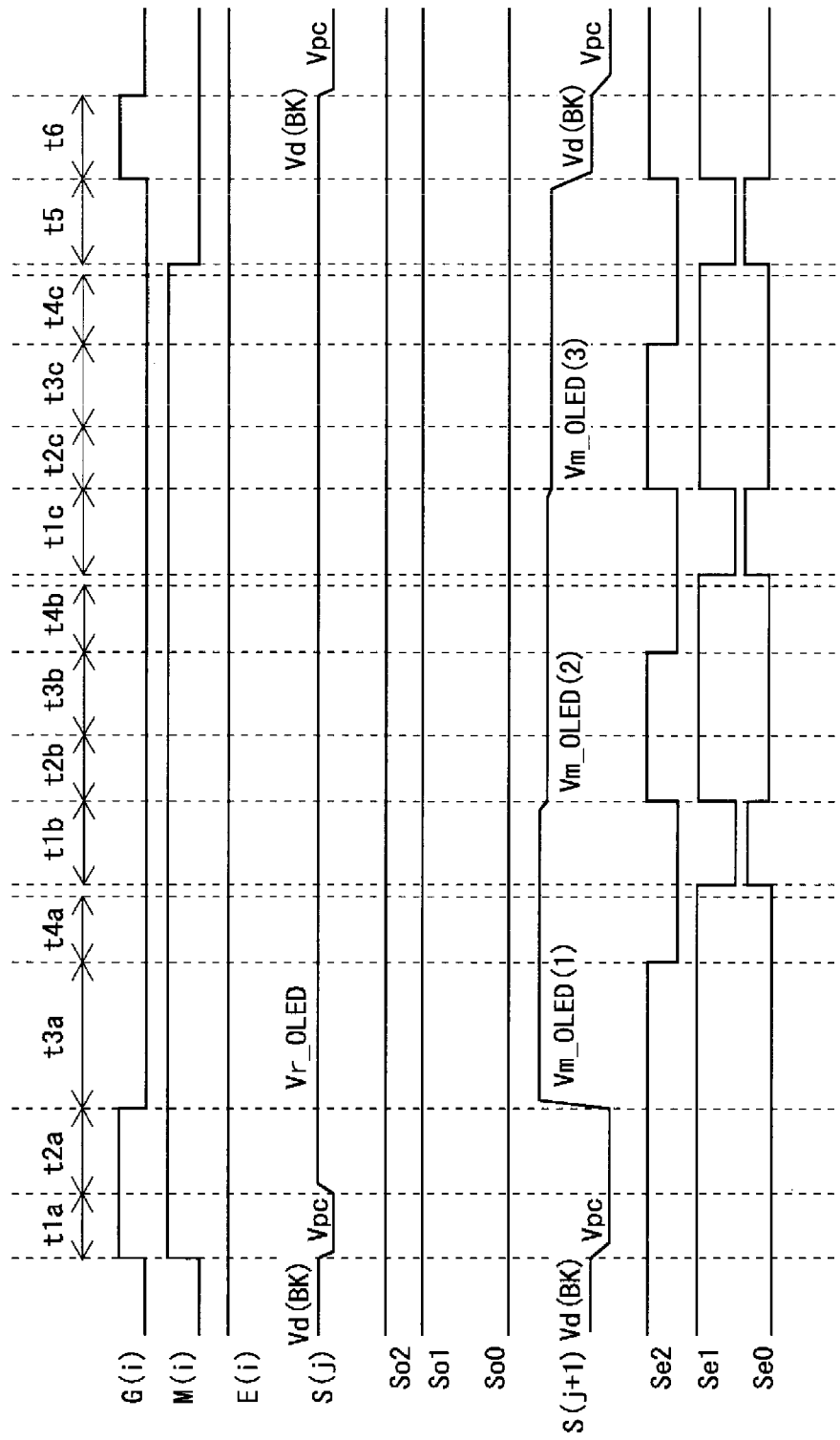
FIG. 22 is a signal waveform diagram when an OLED characteristic is detected in the second embodiment.

FIG. 22 is a signal waveform diagram when the detection of OLED characteristic is performed. With respect to FIG. 22, the periods t1a to t6 are the select periods for the focused monitor row. Immediately before the select period for the focused monitor row, there is a select period for the previous row of the focused monitor row, and immediately after the select period for the focused monitor row, there is a select period for the next row of the focused monitor row.

The periods t1a to t4a are similar to the periods t1 to t4 (see FIG. 10) in the first embodiment. However, a reference sign Vm_OLED(1) is denoted to the current measurement potential applied to the data signal line S(j+1) in the period t3a. At the end of period t4a, the output voltage of the operational amplifier 331 in the output circuit 330 corresponding to the data signal line S(j+1) is the voltage corresponding to the current flowing through the data signal line S(j+1).

In the period t1b, the control signal Se1 is changed from the high level to the low level, and the control signal Se0 is changed from the low level to the high level. As a result, similar to when the TFT characteristic is detected (similar to the period t1b in FIG. 19), the state of the data signal line S(j+1) becomes one of high impedance, and the potential of the internal data line Sin(j+1) immediately before the start timing of the period t1b is maintained. In this state, the output voltage as the monitor data MO of the operational amplifier 331 (charging voltage of the capacitor 332) is converted to a digital signal by the A/D converter 324. The converted monitor data MO is used for the compensation calculation processing in the compensation processing unit 12 in the display control circuit 10.

In the period t2b, the control signals Se2 and Se1 are changed from the low level to the high level, and the control signal Se0 is changed from the high level to the low level. This turns the switches 333 and 334 to the on state and turns the switch 335 to the off state, in the output circuit 330 corresponding to the data signal line S(j+1). As a result, the data signal line S(j+1) and the internal data line Sin(j+1) enter a state of being electrically connected to each other. In addition, in the period t2b, the current measurement potential Vm_OLED(2) is applied to the data signal line S(j+1).

Note that the current measurement potential Vm_OLED(2) is a potential different from the current measurement potential Vm_OLED(1).

The periods t3b to t4b are similar to the periods t3 to t4 in the first embodiment (also similar to the periods t3a to t4a in the present embodiment). The periods t1c to t4c are similar to the periods t1b to t4b. However, in the period t2c, the current measurement potential Vm_OLED(3) is applied to the data signal line S(j+1). Note that the current measurement potential Vm_OLED(3) is a potential different from the current measurement potential Vm_OLED(1) and the current measurement potential Vm_OLED(2).

In the period t5, similar to the period t1b, the output voltage as the monitor data MO of the operational amplifier 331 (charging voltage of the capacitor 332) is converted to a digital signal by the A/D converter 324. In the period t5, the monitor control signal M(i) is changed from the high level to the low level. This turns the monitor control transistor T3 to the off state. The period t6 and subsequent periods are similar to those in the first embodiment.

As described above, in the present embodiment, with respect to the processings of detecting the characteristic of the organic EL element 21 included in the pixel circuit 200(i, j) in the i-th row and the j-th column, during the select period for the monitor row (the i-th row), the plurality of characteristic detection potentials Vm_OLED(1) to Vm_OLED(3) different from each other is sequentially applied to the data signal lines S(j+1).

2.2.3 Summary of Driving Method

In the present embodiment, with respect to both the processings of detecting the TFT characteristic and the processings of detecting the OLED characteristic, a series of processings including the initialization potential application step, the characteristic detection potential application step, the current measurement potential application step, the current measurement charging step, and the A/D conversion step described above are repeatedly performed three times. When the TFT characteristic is detected, as illustrated in FIG. 19, in the period t2a, the application of the characteristic detection potential Vr_TFT(1) to the data signal line S(j) is started, and the application of the current measurement potential Vm_TFT to the data signal line S(j+1) is started. In other words, the characteristic detection potential application step and the current measurement potential application step are started at the same timing. When the TFT characteristic is detected, as illustrated in FIG. 19, in the period t1b, the application of the initialization potential Vpc to the data signal line S(j) is started, and the A/D conversion of the monitor data MO is started (same applies to the period t1c). In other words, the A/D conversion step and the initialization potential application step are started at the same timing.

2.3 Effects

According to the configuration in the related art illustrated in FIG. 24, since after applying the characteristic detection potential to a data signal line, applying of the current measurement potential to the data signal line is required, in a case where the unit monitor processing is repeated during one characteristic detection period, a period of sufficient length to stabilize the measurement current (period t3 in FIG. 26) must be provided for each unit monitor processing. As a result, the monitor time is increased. In contrast, according to the present embodiment, with respect to the characteristic detection of the circuit elements (the drive transistor T2 and the organic EL element 21) in each of the pixel circuits 200, the data signal line functioning as the write line and the data signal line functioning as the read function are different from each other. Thus, during the period in which the detection of the TFT characteristic is performed, there is almost no variation in the potential of the data signal line that functions as the read line. Thus, with respect to the second and subsequent unit monitor processings during one characteristic detection period, the length of the period (periods t3b and t3c in FIG. 19) for stabilizing the measurement current may be relatively short. Furthermore, when the TFT characteristic is detected, for example, the initialization for the second unit monitor processing can be performed during the period in which the A/D conversion of the monitor data MO for the first unit monitor processing is performed. In this manner, two processings that are required to be sequentially performed in the related art can be performed in parallel. As a result, the monitor time is shortened compared to the configuration in the related art.

Figure 23:
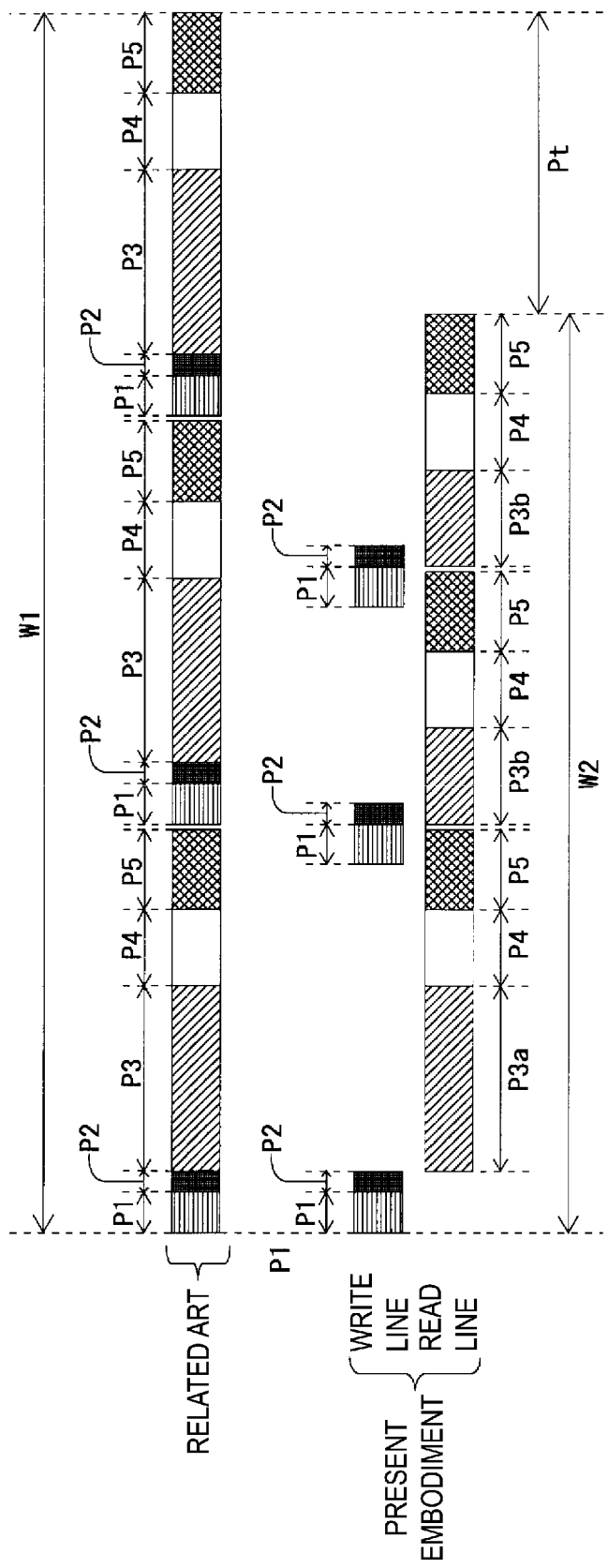
FIG. 23 is a diagram for describing an effect of the second embodiment.

FIG. 23 is a diagram for describing an effect of the present embodiment. Note that in the present embodiment, a stabilization period for the first unit monitor processing during one characteristic detection period is referred to as "first stabilization period", and a stabilization period for the second and subsequent unit monitor processings during one characteristic detection period is referred to as "second stabilization period". The first stabilization period is denoted by reference numeral P3a, and the second stabilization period is denoted by reference numeral P3b. According to the configuration in the related art, a monitor time W1 for the detection of the TFT characteristic is the sum of the lengths of the initialization period P1 for the unit monitor processings of three times, the write period P2, the stabilization period P3, the monitor charging period P4, and the A/D conversion period P5. In contrast, according to the present embodiment, as described above, with respect to the second and subsequent unit monitor processings during one characteristic detection period, the length of the period (the stabilization period) for stabilizing the measurement current may be relatively short. In other words, as illustrated in FIG. 23, the length of the second stabilization period P3b can be shorter than the length of the first stabilization period P3a. As described above, two processings can be performed in parallel on the write line side and the read line side. Thus, as illustrated in FIG. 23, for example, the A/D conversion period P5 for the first unit monitor processing and the initialization period P1 for the second unit monitor processing can be overlapped, and the write period P2 and the second stabilization period P3b for the second unit monitor processing can be overlapped. As described above, the monitor time W2 for the detection of the TFT characteristic in the present embodiment is shorter than the monitor time W1 according to the configuration in the related art by a time Pt.

As described above, in the present embodiment, similar to the first embodiment, with respect to the organic EL display device having the external compensation function, the shorter monitor time can be realized without increasing the number of wiring lines.

3. Other

With respect to the potential applied to the data signal line in the unit monitor processing, as described above, for example, the initialization potential Vpc, the current measurement potential Vm_TFT, the characteristic detection potential Vr_OLED, and the data potential Vd(BK) for black color display may be set to the same potential. In this respect, in a case where the initialization potential Vpc and the characteristic detection potential Vr_OLED are set to the same potential, the period t1 or the period t2 in FIG. 10 is unnecessary in the first embodiment, the period t1 in FIG. 16 is unnecessary in the first modified example of the first embodiment, the period t1 or the period t2 in FIG. 18 is unnecessary in the second modified example of the first embodiment, and the period t1a or the period t2a in FIG. 22 is unnecessary in the second embodiment.

Although the above embodiments (including the modified examples) are described while citing an example of an organic EL display device, the disclosure is not limited thereto. The disclosure can also be applied to display devices including display elements that are controlled by a current (display elements whose luminance or transmittance are controlled by a current). For example, the disclosure can also be applied to an inorganic EL display device including an inorganic light emitting diode, a QLED display device including a Quantum dot Light Emitting Diode (QLED), and the like.

In each of the above-described embodiments (including the modified examples), the detection of the TFT characteristic is performed during the vertical scanning period, and the detection of the OLED characteristic is performed when the power is turned on or off. However, the disclosure is not limited thereto, and the detection of the TFT characteristic and the detection of the OLED characteristic can be performed in other aspects.

REFERENCE SIGNS LIST

1 Organic EL display device
20 Display portion
21 Organic EL element
30 Source driver
200 Pixel circuit
330 Output circuit (output circuit also serving as a current monitor circuit)
S, S(j), S(j+1), S(1) to S(n+1) Data signal line
T1 Writing control transistor
T2 Drive transistor
T3 Monitor control transistor
T4 Light emission control transistor
Vpc Initialization potential
Vr_TFT, Vr_TFT(1) to Vr_TFT(3) Characteristic detection potential (when detection of TFT characteristic is performed)
Vm_TFT Current measurement potential (when detection of TFT characteristic is performed)
Vr_OLED Characteristic detection potential (when detection of OLED characteristic is performed)
Vm_OLED, Vm_OLED(l) to Vm_OLED(3). Current measurement potential (when detection of OLED characteristic is performed)

The invention claimed is:
1. A display device comprising:
a plurality of data signal lines;
a plurality of scanning signal lines;
a plurality of monitor control lines corresponding to the plurality of scanning signal lines on a one-to-one basis; and
pixel circuits of m rows×n columns (where m and n are integers of 2 or more) provided corresponding to intersections of the plurality of data signal lines and the plurality of scanning signal lines and including a display element, luminance of the display element being controlled by a current, and a drive transistor config- ured to control a current to be supplied to the display element, the display device having a function of detecting a characteristic of the drive transistor, wherein the display device includes a data signal line drive circuit configured to apply a data signal to the plurality of data signal lines, a scanning signal line drive circuit configured to apply a scanning signal to the plurality of scanning signal lines, and a monitor control line drive circuit configured to apply a monitor control signal to the plurality of monitor control lines, the data signal line drive circuit has a function of measuring a current flowing through each of the plurality of data signal lines, and a pixel circuit in an i-th row and a j-th column (where i is an integer of 1 or more and m or less, and j is an integer of 1 or more and n or less) includes the display element provided between a first power supply voltage line supplied with a first supply voltage and a second power supply voltage line supplied with a second supply voltage and including a first terminal and a second terminal connected to the second power supply voltage line, the drive transistor including a control terminal, a first conduction terminal connected to the first power supply voltage line, and a second conduction terminal, a writing control transistor including a control terminal connected to a scanning signal line in the i-th row, a first conduction terminal connected to a data signal line in the j-th column, and a second conduction terminal connected to the control terminal of the drive transistor, and a monitor control transistor including a control terminal connected to a monitor control line in the i-th row, a first conduction terminal connected to the second conduction terminal of the drive transistor and a second conduction terminal connected to a data signal line in a (j+1)-th column.

2. The display device according to claim 1, wherein when the characteristic of the drive transistor included in the pixel circuit in the i-th row and the j-th column is detected, the data signal line drive circuit is configured to start application of a characteristic detection potential as a data signal configured to detect the characteristic of the drive transistor to the data signal line in the j-th column and application of a current measurement potential as a data signal configured to measure a current representative of the characteristic of the drive transistor to the data signal line in the (j+1)-th column at a same timing.

3. The display device according to claim 1 or 2, wherein the data signal line drive circuit includes a current measuring unit corresponding to each of the plurality of data signal lines and configured to measure a current flowing through each of the plurality of data signal lines, when the characteristic of the drive transistor included in the pixel circuit in the i-th row and the j-th column is detected, by the monitor control line drive circuit turning the monitor control transistor to an on state, the second conduction terminal of the drive transistor is connected to a current measuring unit corresponding to the data signal line in the (j+1)-th column.

4. The display device according to claim 1, wherein (n+1) data signal lines are provided as the plurality of data signal lines.

5. The display device according to claim 1, wherein with respect to a processing of detecting the characteristic of the drive transistor included in the pixel circuit in the i-th row and the j-th column, during a select period for the i-th row, being a period from when the scanning signal line in the (i−1)-th row changes from an on state to an off state to when the scanning signal line in the (i+1)-th row changes from the off state to the on state, the data signal line drive circuit sequentially applies a plurality of characteristic detection potentials different from each other as data signals configured to detect the characteristic of the drive transistor to the data signal line in the j-th column.

6. The display device according to claim 1, wherein the display device further has a function of detecting a characteristic of the display element, and the first conduction terminal of the monitor control transistor is connected to the first terminal of the display element in addition to the second conduction terminal of the drive transistor.

7. The display device according to claim 6, wherein when the characteristic of the display element included in the pixel circuit in the i-th row and the j-th column is detected, the data signal line drive circuit is configured to start application of a characteristic detection potential as a data signal configured to detect the characteristic of the display element to the data signal line in the j-th column and application of a current measurement potential as a data signal configured to measure a current representative of the characteristic of the display element to the data signal line in the (j+1)-th column at a same timing.

8. The display device according to claim 6, wherein the data signal line drive circuit includes a current measuring unit corresponding to each of the plurality of data signal lines and configured to measure a current flowing through each of the plurality of data signal lines, when the characteristic of the display element included in the pixel circuit in the i-th row and the j-th column is detected, by the monitor control line drive circuit turning the monitor control transistor to an on state, the first terminal of the display element is connected to a current measuring unit corresponding to the data signal line in the (j+1)-th column.

9. The display device according to claim 8, wherein with respect to a processing of detecting the characteristic of the display element included in the pixel circuit in the i-th row and the j-th column, during a select period for the i-th row, being a period from when the scanning signal line in the (i−1)-th row changes from an on state to an off state to when the scanning signal line in the (i+1)-th row changes from the off state to the on state, the data signal line drive circuit sequentially applies a plurality of characteristic detection potentials different from each other as data signals configured to measure a current representative of the characteristic of the display element to the data signal line in the (j+1)-th column.

10. The display device according to claim 8, wherein the data signal line drive circuit includes a current measuring unit corresponding to each of the plurality of data signal lines and configured to measure a current flowing through each of the plurality of data signal lines, when the characteristic of display element included in the i-th row is detected, by the monitor control line drive circuit turning the monitor control transistor included in the i-th row to the an state, a first terminal of a display element included in a pixel circuit in the i-th row and a z-th column (where z is an integer of 1 or more and n—1 or less) is connected to a current measuring unit corresponding to a data signal line in a (z+1) column, and a first terminal of the display element included in the pixel circuit in the i-th row and the (z+1) column is connected to a current measuring unit corresponding to a data signal line in a (z+2) column, and the data signal line drive circuit applies a current measurement potential as a data signal configured to measure a current representative of the characteristic of the display element to both of the data signal line in the (z+1) column and the data signal line in the (z+2) column.

11. The display device according to claim 1,
wherein each pixel circuit further includes a holding capacitor including a first electrode connected to the control terminal of the drive transistor and a second electrode connected to the first conduction terminal or the second conduction terminal of the drive transistor or the second terminal of the display element.

12. A driving method of a display device including a plurality of data signal lines, a plurality of scanning signal lines, and pixel circuits of m rows×n columns (m and n are integers of 2 or more) provided corresponding to intersections of the plurality of data signal lines and the plurality of scanning signal lines, the display device having a function of detecting a characteristic of a circuit element included in each pixel circuit, the driving method comprising steps of:
applying an initialization potential configured to initialize a state of the pixel circuit to each of the plurality of data signal lines
applying a characteristic detection potential as a data signal configured to detect the characteristic of the circuit element to each of the plurality of data signal lines,
applying a current measurement potential as a data signal configured to measure a current representative of a characteristic of the circuit element to each of the plurality of data signal lines,
performing current measurement charging based on a current flowing through each of the plurality of data signal lines, and
performing A/D conversion based on a charging voltage obtained in the performing current measurement charging,
wherein at least two of the applying an initialization potential, the applying a characteristic detection potential, the applying a current measurement potential, the performing current measurement charging, and the performing A/D conversion are started at a same timing.

13. The driving method according to claim 12,
wherein each pixel circuit includes, as the circuit element, a display element, luminance of the display element being controlled by a current, and a drive transistor configured to control a current to be supplied to the display element, and
a characteristic of the drive transistor is detected by a series of steps of the applying an initialization potential, the applying a characteristic detection potential, the applying a current measurement potential, the performing current measurement charging, and the performing A/D conversion.

14. The driving method according to claim 13,
wherein the applying a characteristic detection potential and the applying a current measurement potential are started at a same timing.

15. The driving method according to claim 13,
wherein when the characteristic detection potential is applied to the data signal line in the j-th column (where j is an integer of 1 or more and n or less) in the applying a characteristic detection potential, the current measurement potential is applied to the data signal line in the (j+1)-th column in the applying a current measurement potential.

16. The driving method according to claim 15,
wherein with respect to a processing of detecting the characteristic of the drive transistor included in the pixel circuit in the i-th row and the j-th column (where i is an integer of 1 or more and m or less, and j is an integer of 1 or more and n or less), during a select period for the i-th row, being a period from when the scanning signal line in the (i−1)-th row changes from the on state to the off state to when the scanning signal line in the (i+1)-th row changes from the off state to the on state, the series of steps is repeated a plurality of times.

17. The driving method according to claim 12,
wherein each pixel circuit includes, as the circuit element, a display element, luminance of the display element being controlled by a current, and a drive transistor configured to control a current to be supplied to the display element, and
a characteristic of the display element is detected by a series of steps of the applying an initialization potential, the applying a characteristic detection potential, the applying a current measurement potential, the performing current measurement charging, and the performing A/D conversion.

18. The driving method according to claim 17,
wherein the applying a characteristic detection potential and the applying a current measurement potential are started at a same timing.

19. The driving method according to claim 17,
wherein with respect to a processing of detecting the characteristic of the display element included in the pixel circuit in the i-th row, during the (K+1)-th processing, the characteristic detection potential is applied to the data signal lines in the odd-numbered column in the applying a characteristic detection potential, and the current measurement potential is applied to the data signal lines in the even-numbered column in the applying a current measurement potential, and
during the (K+1)-th processing, the characteristic detection potential is applied to the data signal lines in the even-numbered column in the applying a characteristic detection potential, and the current measurement potential is applied to the data signal lines in the odd-numbered column in the applying a current measurement potential.

20. The driving method according to claim 19,
wherein in the applying a characteristic detection potential, the characteristic detection potential as the data signal configured to detect the characteristic of the display element is applied to both of the data signal lines in the odd-numbered column and the data signal lines in the even-numbered column, and
in the applying a current measurement potential, the current measurement potential as the data signal configured to measure a current representative of the characteristic of the display element is applied to both of the data signal lines in the odd-numbered column and the data signal lines in the even-numbered column.

\* \* \* \* \*